(12) United States Patent
Akimoto et al.

(10) Patent No.: US 7,241,061 B2
(45) Date of Patent: Jul. 10, 2007

(54) COATING AND DEVELOPING SYSTEM AND COATING AND DEVELOPING METHOD

(75) Inventors: Masami Akimoto, Koshi-Machi (JP); Shinichi Hayashi, Koshi-Machi (JP); Yasushi Hayashida, Koshi-Machi (JP); Nobuaki Matsuoka, Koshi-Machi (JP); Yoshio Kimura, Koshi-Machi (JP); Issei Ueda, Koshi-Machi (JP); Hikaru Ito, Minato-Ku (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 11/336,990

(22) Filed: Jan. 23, 2006

(65) Prior Publication Data

US 2006/0162858 A1 Jul. 27, 2006

Related U.S. Application Data

(63) Continuation-in-part of application No. 11/117,552, filed on Apr. 29, 2005.

(30) Foreign Application Priority Data

Jan. 21, 2005 (JP) ............................. 2005-014715
Oct. 7, 2005 (JP) ............................. 2005-294567

(51) Int. Cl.
*G03D 5/00* (2006.01)

(52) U.S. Cl. ........................................ 396/611; 355/27
(58) Field of Classification Search ................ 396/611; 355/27; 118/672; 430/327, 331
See application file for complete search history.

(56) References Cited

U.S. PATENT DOCUMENTS 5,937,223 A * 8/1999 Akimoto et al. ............ 396/604

| 6,454,472 B1 | 9/2002 | Kim et al. |
| 6,485,893 B1 * | 11/2002 | Matsuyama ................. 430/322 |
| 7,008,124 B2 * | 3/2006 | Miyata ....................... 396/611 |
| 2005/0287821 A1 | 12/2005 | Higashi et al. |
| 2006/0162646 A1 * | 7/2006 | Akimoto et al. ............. 118/52 |
| 2006/0164613 A1 * | 7/2006 | Akimoto et al. ............. 355/27 |
| 2006/0165408 A1 * | 7/2006 | Akimoto et al. ............. 396/564 |
| 2006/0165409 A1 * | 7/2006 | Akimoto et al. ............. 396/611 |

FOREIGN PATENT DOCUMENTS

| JP | 3337677 | 8/2002 |
| JP | 2004-193597 | 7/2004 |

* cited by examiner

*Primary Examiner*—W. B. Perkey
(74) *Attorney, Agent, or Firm*—Oblon, Spivak, McClelland, Maier & Neustadt, P.C.

(57) ABSTRACT

A coating and developing system includes a resist film forming unit block and antireflection film forming unit blocks stacked up in layers to form a resist film and an antireflection film underlying the resist film and an antireflection film overlying the resist film in a small space. The coating and developing system is capable of coping with either of a case where antireflection films are formed and a case where any antireflection film is not formed and needs simple software. Film forming unit blocks, namely, a TCT layer B3, a COT layer B4 and a BCT layer B5, and developing unit blocks, namely, DEV layers B1 and B2, are stacked up in layers in a processing block S2. The TCT layer B3, the COT layer B4 and the BCT layer B5 are used selectively in the case where antireflection films are formed and the case where any antireflection film is not formed. The coating and developing system is controlled by a simple carrying program and simple software.

21 Claims, 23 Drawing Sheets

|  |  |  |  |  |
|---|---|---|---|---|
| B5 | COL 5 | CHP 5 | CHP 5 | CHP 5 |
|  | COL 5 | COL 5 | CHP 5 | CHP 5 |
| B4 | COL 4 | CHP 4 | CHP 4 | WEE |
|  | COL 4 | COL 4 | CHP 4 | ADH |
| B3 | COL 3 | CHP 3 | CHP 3 | WEE |
|  | COL 3 | COL 3 | CHP 3 | CHP 3 |
| B2 | POST 2 | POST 2 | PEB 2 | PEB 2 |
|  | POST 2 | PEB 2 | COL 2 | COL 2 |
| B1 | POST 1 | POST 1 | PEB 1 | PEB 1 |
|  | POST 1 | PEB 1 | COL 1 | COL 1 |

FIG. 5

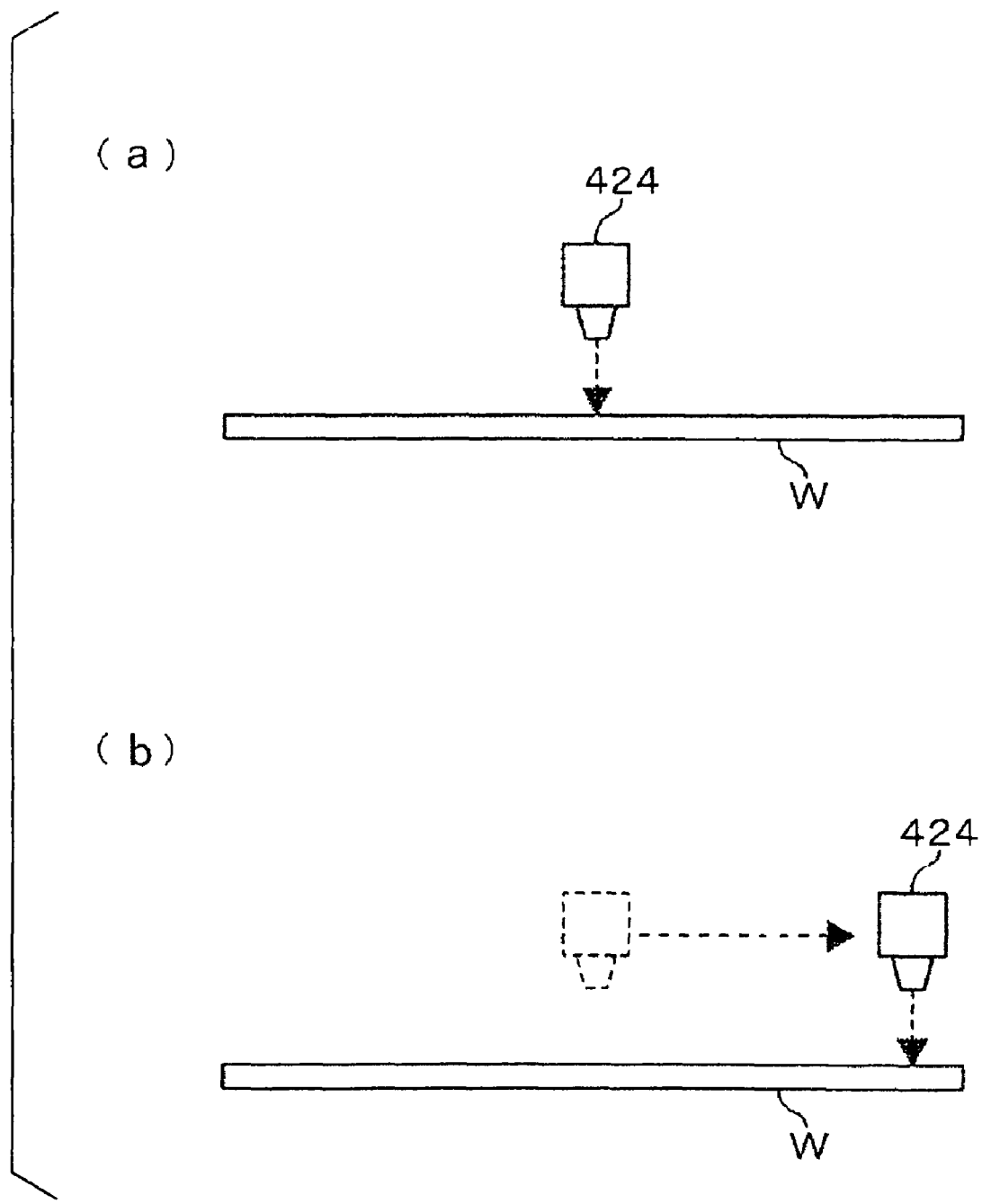
F I G. 15

BACKGROUND ART

COATING AND DEVELOPING SYSTEM AND COATING AND DEVELOPING METHOD

BACKGROUND OF THE INVENTION

1. Field of the Invention

The present invention relates to a coating and developing system for applying a liquid resist to a surface of a substrate, such as a semiconductor wafer or a LCD substrate, namely, a glass substrate for a liquid crystal display, to coat the surface with a resist film and developing the exposed resist film, and a coating and developing method.

2. Description of the Related Art

In a manufacturing process for manufacturing semiconductor devices or LCD panels, a resist pattern is formed on a substrate by a photolithographic process. The photolithographic process includes a series of steps of forming a resist film on a substrate, such as a semiconductor wafer (hereinafter, referred to simply as "wafer") by applying a liquid resist to the surface of the substrate, exposing the resist film to light through a photomask, and developing the exposed resist film to form a desired resist pattern.

Generally, this photolithographic process is carried out by a resist pattern forming system built by combining an exposure system with a coating and developing system. FIG. 23 shows a known resist pattern forming system of this type disclosed in, for example, Patent document 1. Referring to FIG. 23, a carrier 10 holding a plurality of wafers W is delivered onto a carrier stage 11 installed in a carrier handling block 1A, and then a transfer arm 12 transfers the wafer W from the carrier 10 to a processing block 1B. The wafer W is delivered to a coating unit 13A installed in the processing block 1B. The coating unit 13A applies a liquid resist to a surface of the wafer W in a resist film. Subsequently, the wafer coated with the resist film is carried via an interface block 1C to an exposure system 1D.

The wafer W is returned to the processing block 1B after being subjected to an exposure process. A developing unit 13B subjects the wafer W to a developing process, and then the wafer W is returned to the carrier 10. Indicated at 14 (14a to 14c) in FIG. 11 are shelf units including a heating unit for processing a wafer by a predetermined heating process, a cooling unit for processing the wafer by a predetermined cooling process and a transfer stage. Each of the shelf units processes a wafer before or after the wafer is processed by the coating unit 13A and the developing unit 13B. Each of two carrying devices 15A and 15B installed in the processing block 1B carries a wafer W in the processing block 1B from one to another of modules in which the wafer W is to be placed, such as the coating unit 13A, the developing unit 13B and the shelf units 14a to 14c. Each of all the wafers W to be processed by the foregoing processes is carried to desired modules according to a carrying schedule specifying time points when the wafer W is to be carried to the modules.

Resist films of different types are formed in different coating mode, respectively. A first coating mode forms a resist film and antireflection films over and under the resist film, a second coating mode forms a resist film and an antireflection film over or under the resist film, and a third coating mode forms only a resist film. Therefore, in some cases, the units necessary for forming films, such as the coating unit, the heating unit and the cooling unit, processes wafers of different lots under different processing conditions. In such a case, a complex carrying program must be prepared for each type of the resist film when the coating unit, the heating unit and the cooling unit are installed in the same processing block because the different types of resist films are formed by using different units and are carried along different carrying paths. Since carrying programs to be produced according to the carrying schedule are originally complex, work for producing a carrying program for each of desired resist films is very complex and troublesome and such work is practically impossible.

When many units including the coating unit, the heating unit and the cooling unit are installed in the same processing block, the processing block is inevitably large and occupies a large area. A recent exposure system operates at a high throughput. Consequently, the coating and developing system is required to have a high processing ability corresponding to the throughput of the exposure system. However, the same carrying system operates to carry a wafer W to the coating unit for forming a resist film before the exposure process, to carry a wafer to an antireflection film forming unit for forming the antireflection film and to carry a wafer coated with an exposed resist film to the developing unit after exposure, it is difficult to operate the exposure system at a high throughput.

The inventors of the present invention have been making studies to develop a multilayer system including an area holding modules for processes preceding an exposure process and an area holding modules for containing modules for carrying out processes succeeding the exposure process disposed in a vertical arrangement to reduce load on carrying means, to improve carrying efficiency, to increase the throughput of a coating and developing system, and having a large degree of freedom of carrying route selection.

Although construction that disposes a coating area and a developing area in a vertical arrangement and provides the coating area and the developing area with individual carrying means is mentioned in Patent document 2, nothing is mentioned in Patent document 2 about improving carrying efficiency and increasing the degree of freedom of carrying route selection.

Patent document 1: JP 2004-193597 A
Patent document 2: Jpn. Pat. No. 3337677

SUMMARY OF THE INVENTION

The present invention has been made under such circumstances and it is therefore an object of the present invention to provide techniques for forming antireflection films over and under a resist film, capable of reducing necessary space, of increasing the degree of freedom of carrying route selection and of highly efficiently carrying a wafer.

Another object of the present invention is to provide techniques capable of dealing with either of a case where an antireflection film is formed on a resist film and a case where any antireflection film is not formed on a resist film, and of simplifying software.

A coating and developing system according to the present invention includes: a carrier handling block for receiving a substrate carried thereto by a carrier; a processing block for processing a substrate transferred thereto from the carrier handling block to form films including a resist film on a substrate; an interface block for carrying a substrate to an exposure system, receiving a substrate processed by the exposure system and returning the substrate to the processing block to subject the substrate to a developing process and to transfer the substrate processed by the developing process to the carrier handling block; wherein a) the processing block is provided with a plurality of film forming unit blocks stacked up in layers and a developing unit block put on the film forming unit blocks, b) the plurality of film forming unit blocks stacked up in layers include a liquid resist applying unit block for applying a liquid resist to a substrate, a liquid-processing unit block for applying a chemical solution for forming an antireflection film to a substrate before the liquid resist is applied to the substrate, and a liquid-processing unit block for applying a chemical solution for forming an antireflection film to a substrate after the liquid resist has been applied to the substrate; and c) each of the unit blocks includes a liquid-processing unit for applying a chemical solution to a substrate, a heating unit for heating a substrate, and a carrying means for carrying a substrate from one to another of the liquid-processing units, the heating unit and the cooling unit. Each of the unit blocks may include a cooling unit for cooling a substrate.

The coating and developing system according to the present invention may further include carrying recipes specifying substrate carrying paths in the unit blocks; and a mode selecting means for selecting one of a first carrying mode in which a substrate is carried to all the unit blocks, a second carrying mode in which a substrate is carried to a liquid resist applying unit block, a liquid-processing unit block for forming an antireflection film before the liquid resist is applied to a substrate and a developing unit block for carrying out a developing process, and a third carrying mode in which a substrate is carried to a liquid resist applying unit block, a chemical solution applying unit block for applying a chemical solution for forming an antireflection film after the liquid resist has been applied to the wafer, and a developing unit block for carrying out a developing process; wherein the mode selecting means selects the unit blocks to which a substrate is to be carried and selects the carrying recipes for the selected unit blocks to process a substrate.

The coating and developing system according to the present invention may further include a first transfer stage group of first transfer stages stacked up in layers for the unit blocks, disposed on the side of the carrier handling block to receive a substrate from and deliver a substrate to the carrying means of each unit block; a second transfer stage group of second transfer stages stacked up in layers and disposed on the side of the interface block to receive a substrate from and deliver a substrate to the carrying means of each unit block; a first substrate transfer means for carrying a substrate from one to another of the first delivery stages; and a second substrate carrying means for carrying a substrate from one to another of the second delivery stages. The first delivery stage group may include a transfer stage, for the carrier handling block, via which a substrate is carried between the carrier handling block and the processing block, and the second delivery stage group may include an interface block transfer stage via which a substrate is carried between the interface block and the processing block.

Preferably, the liquid-processing unit included in the film forming unit block has a plurality of laterally arranged substrate holding devices, respectively for holding a plurality of substrates, placed in a common processing vessel, and a common chemical solution applying nozzle for applying a chemical solution to substrates held by the plurality of substrate holding devices.

In the coating and developing system according to the present invention, an auxiliary block provided with functional units, which carries out processes after a film forming process and before an exposure process and/or after the exposure process and before the developing process and after the developing process, may be interposed between the processing block and the interface block. The functional units of the auxiliary block may include at least one of a film thickness examining unit for examining the thickness of a film formed on a substrate, a cleaning unit for cleaning a substrate before the exposure process and/or after the exposure process, a defocus inspecting device for finding a faultily registered pattern occurred in the exposure system, an irregular coating detecting device for detecting irregularities in a liquid resist film, a faulty development detecting device for detecting defects in a developed film, a particle counting device for counting particles adhering to a substrate, a comet detecting device for detecting comets in a resist film formed on a substrate, a splash-back detecting device, a defect detecting device for detecting defects in the surface of a substrate, a scum detecting device for detecting residual resist remaining on a substrate processed by a developing process, a defect detecting device for detecting defects caused by a liquid resist applying process and/or a developing process, a line width measuring device for measuring lines of a patterned resist film formed on a substrate, and a register examining device for examining the register of a photomask on a substrate after an exposure process. When the exposure system forms a liquid layer on the surface of a substrate for immersion exposure, the functional unit of the auxiliary block may be a cleaning unit for cleaning a substrate processed by immersion exposure.

Preferably, the plurality film forming unit blocks of the coating and developing system are the same in the layout of the liquid-processing unit, the heating unit, the cooling unit and the carrying means.

The exposure system may form a liquid layer on the surface of a substrate for immersion exposure and the functional unit included in the auxiliary block may be a protective film forming unit for forming a water-repellent protective film on the resist film. The exposure system may form a liquid layer on the surface of a substrate for immersion exposure and the functional unit included in the auxiliary block may be a protective film removing unit for removing the water-repellent protective film. The protective film removing unit may be included in the developing unit block. The exposure system may form a liquid layer on the surface of a substrate for immersion exposure and may include a cleaning unit for cleaning a substrate processed by the immersion-exposure process included in the interface block. A film forming unit block for forming a water-repellent protective film on the resist film formed on a substrate may be stacked on the plurality of stacked film forming unit blocks.

The first transfer stage group may be provided with a temperature adjusting unit for supporting a substrate before a film is formed on the substrate and for adjusting the temperature of the substrate to a temperature for a process for applying a film forming chemical solution to the substrate. The second transfer stage group may be provided with a temperature adjusting unit for supporting a substrate before a film is formed on the substrate and for adjusting the temperature of the substrate to a temperature for a process for applying a film forming chemical solution to the substrate.

The temperature adjusting unit includes a first temperature adjusting plate for supporting, for example, a substrate heated by a heating unit and for roughly adjusting the temperature of the substrate to a first temperature, and a second temperature adjusting plate for supporting a substrate and for precisely adjusting the temperature of the substrate.

The coating and developing system carries out a coating and developing method including the steps of: forming a first antireflection film on a surface of a substrate by the film forming unit block; forming a resist film by applying a liquid resist to the first antireflection film formed on the surface of the substrate by the film forming unit block other than that formed the first antireflection film; forming a second antireflection film over the resist film by the film forming unit block other than that formed the resist film; and subjecting the substrate coated with the resist film and processed by an exposure process to a developing process.

The coating and developing system carries out a coating and developing method including the steps of: selecting one of a first carrying mode in which a substrate is carried to all the film forming unit blocks, a second carrying mode in which a substrate is carried to the liquid resist applying unit block and to a liquid-processing unit block for forming an antireflection film before a resist film is formed on a substrate, and a third carrying mode in which a substrate is carried to the liquid resist applying unit block for applying a liquid resist to the substrate and to the liquid-processing unit block for applying a chemical solution for forming an antireflection film to the substrate after the liquid resist has been applied to the substrate; forming films on the substrate by carrying the substrate from one to another of the film forming unit blocks in the selected carrying mode; and subjecting the substrate coated with the films and processed by an exposure process to a developing process by a developing unit block in a layer other than layers including the plurality of film forming unit blocks.

According to the present invention, the plurality of stacked film forming unit blocks include a resist film forming unit block for forming a resist film on a substrate, an antireflection film forming unit block for forming an antireflection film on a substrate before a resist film is formed on the substrate, and an antireflection forming unit block for forming an antireflection film over a resist film formed on a substrate. The processing block capable of forming antireflection films over and under a resist film occupies a small area and needs a small space for installation.

The coating and developing system is capable of dealing with either of a process that forms an antireflection film and a process that does not form any antireflection film by selectively using the film forming unit blocks. Since a substrate is carried along the same substrate carrying paths in all the unit blocks, a substrate can be carried according to a simple carrying program even in a case where the coating and developing system forms different films and hence software is simplified.

The first and the second substrate carrying means carry a substrate between the shelf unit blocks. A substrate subjected to film forming processes by the film forming unit block may be carried to the next film forming unit block by either of the first and the second substrate carrying means. Thus the coating and developing system has a large degree of freedom of carrying rout selection. Since the two substrate carrying means operate to carry substrates between the unit blocks, carrying load is shared by the two substrate carrying means, carrying efficiency can be improved and throughput can be increased. Since the exclusive substrate carrying means capable of accessing all the unit blocks are used for carrying a substrate between the unit blocks on different layers, the carrying system is simple and a carrying program can be easily simplified.

Since the plurality of film forming devices for forming films on a substrate are disposed in the common processing vessel, the film forming devices operated in the same processing atmosphere, and a temperature control system and a chemical solution applying nozzle can be used by all the film forming devices.

BRIEF DESCRIPTION OF THE DRAWINGS

FIG. 5 is a front elevation of the shelf units of the coating and developing system shown in FIG. 1;

FIGS. 15(a) and 15(b) are views of assistance in explaining a cleaning method to be carried out by a cleaning unit included in the coating and developing system;

REFERENCE CHARACTERS

Figure 1:
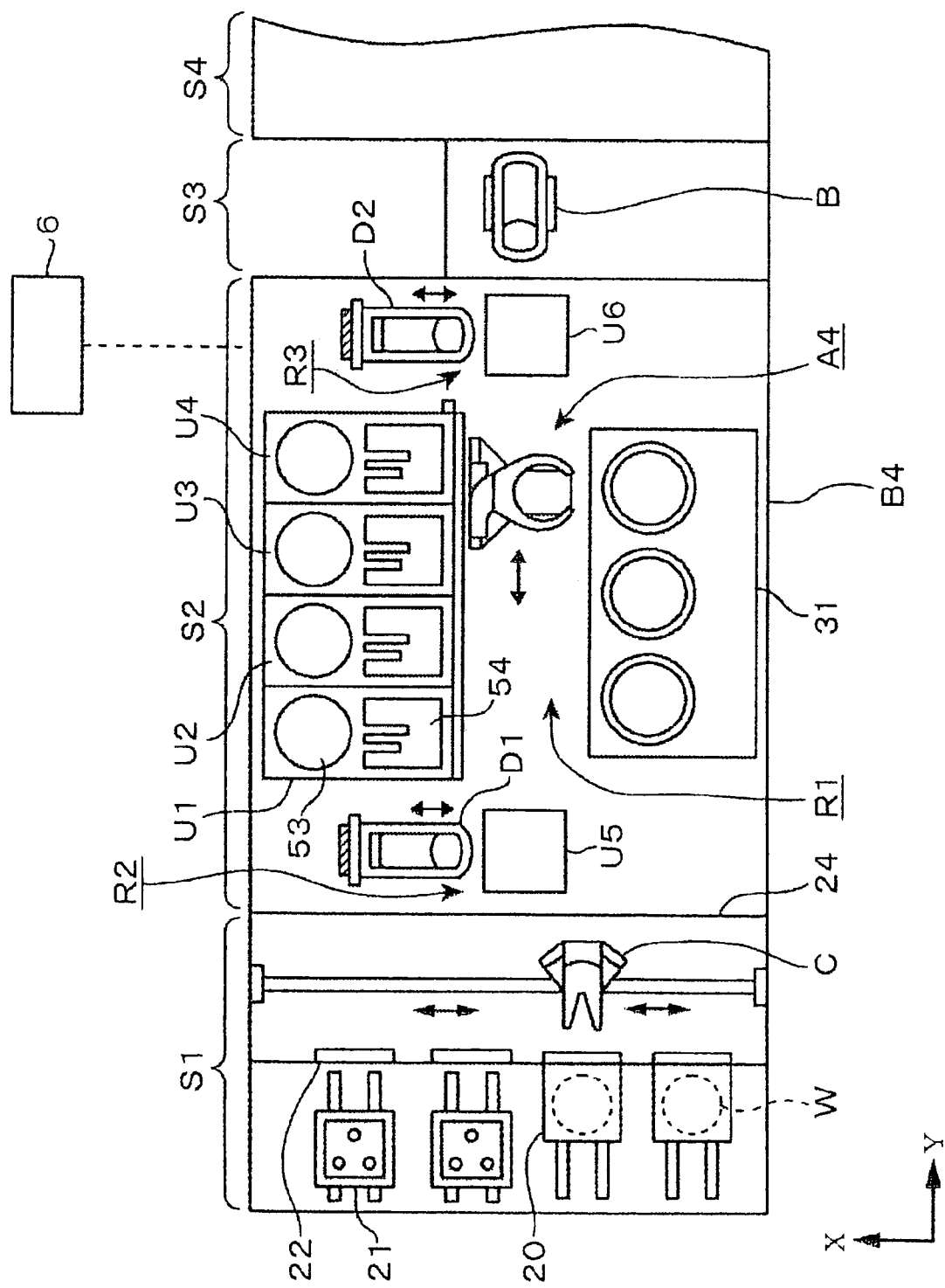
FIG. 1 is a schematic plan view of a coating and developing system in a first embodiment according to the present invention.

W: Semiconductor wafer
20: Carrier

S1: Carrier block
S2: Processing block
S3: Interface block
S4: Exposure system
S5: Auxiliary block
A1 to A5: Main arms
B: Interface arm
C: Transfer arm
D1: First transfer arm
D2: Second transfer arm
E: Third transfer arm
F1, F2: Fourth transfer arms
31: Coating unit
32: Developing unit
33: First antireflection film forming unit
34: Second antireflection film forming unit
6: Control unit
71: Inspection unit
72: Cleaning unit
401: Protective film forming unit
402: Protective film removing unit
403: Cleaning unit
500: Temperature adjusting unit
510: First temperature adjusting plate
520: Second temperature adjusting plate

DESCRIPTION OF THE PREFERRED EMBODIMENTS

Figure 2:
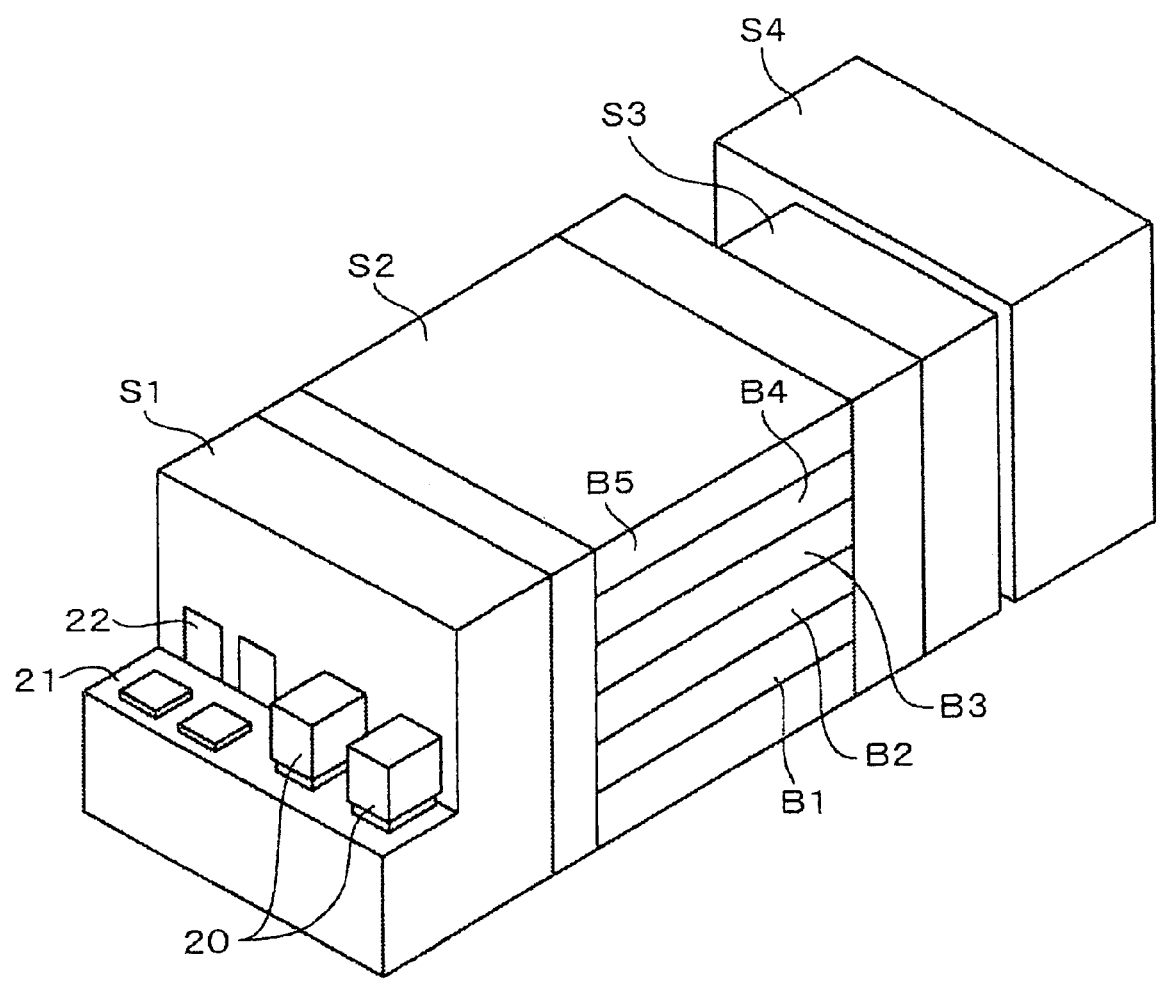
FIG. 2 is a schematic perspective view of the coating and developing system shown in FIG. 1.
Figure 3:
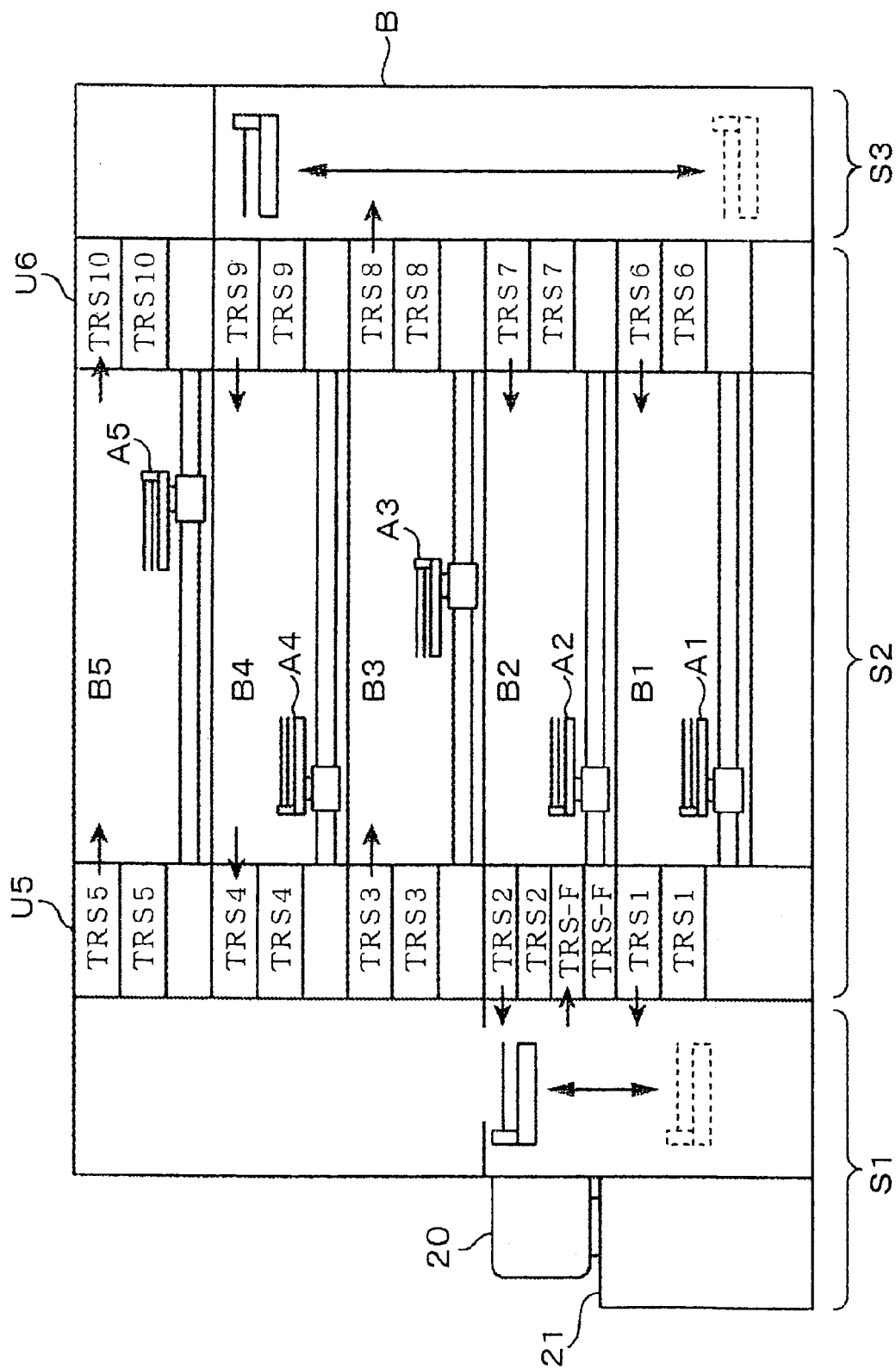
FIG. 3 is a schematic sectional side elevation of the coating and developing system shown in FIG. 1.

A coating and developing system in a first embodiment according to the present invention will be described. FIG. 1 is a schematic plan view of a coating and developing system in a first embodiment according to the present invention to be used as a resist pattern forming system, FIG. 2 is a schematic perspective view of the coating and developing system and FIG. 3 is a schematic sectional side elevation of the coating and developing system. The coating and developing system has a carrier handling block S1 for receiving a closed carrier 20 holding, for example, thirteen wafers W, namely, substrates, and sending the same out, a processing block S2 including, for example, five vertically arranged unit blocks B1 to B5, and an interface block S3. An exposure system S4 is connected to the interface block S3.

The carrier handling block S1 has a carrier support table 21 capable of supporting a plurality of carriers 20 thereon, gates 22 formed in a wall behind the carrier support table 21, and a transfer arm C capable of extending through the gate 22 to the carrier 20 to take out the wafer W from the carrier 20. The transfer arm C is able to move in horizontal directions and vertical directions, to turn about a vertical axis and to move in directions parallel to a direction in which the carriers 20 are arranged to carry the wafer W from one to another of transfer stages TRS1, TRS2 and TRS3 of a unit block B1.

The processing block S2 surrounded by a casing 24 is connected to the back end of the carrier handling block S1. In this embodiment, the processing block S2 includes a first unit block (first DEV layer) B1 for carrying out a developing process, a second unit block (second DEV layer) B2 for carrying out a developing process, a third unit block (TCT layer) B3 for carrying out an antireflection film forming process for forming a second antireflection film over a resist film, a fourth unit block (COT layer) B4 for carrying out a liquid resist applying process, and a fifth unit block (BCT layer) B5 for carrying out an antireflection film forming process for forming a first antireflection film under the resist film. The unit blocks B1 to B5 are arranged vertically upward in that order. The DEV layers B1 and B2 are developing unit blocks, the TCT layer B3, the COT layer B4 and the BCT layer B5 are film forming unit blocks.

The construction of the first to the fifth unit block B (the blocks B1 to B5) will be described. The unit blocks B1 to B5 are provided with main arms A1 to A5, respectively. Each of the unit blocks B1 to B5 is provided with a liquid-processing unit for applying a chemical solution to the wafer W, a heating unit and a cooling unit for carrying out a pretreatment and a post-treatment before and after a process to be carried out by the liquid-processing unit. The main arms A1 to A5 are exclusive carrying means A for carrying the wafer W from one to another of the liquid-processing units, the heating units and the cooling units.

The unit blocks B1 to B5 are the same in the layout of the liquid-processing unit, the heating unit, the cooling unit, and the main arm A; that is, the centers of spin chucks for holding the wafer W of the liquid-processing units are aligned, the centers of heating plates of the heating units are aligned and the centers of cooling plates in the cooling units are aligned.

The COT layer B4 shown in FIG. 1 will be described by way of example. A carrying area R1 extending in a substantially central part of the COT layer B4 along the length of the COT layer B4 parallel to the Y-axis in FIG. 1 connects the carrier handling block S1 and the interface block S3. The wafer W is carried in the carrying area R1.

A coating unit 31, namely, a liquid-processing unit, provided with a plurality of coating devices for coating the wafer with a resist film is disposed on the right-hand side, as viewed from the side of the carrier handling block S1, of the carrying area R1. Each of the unit blocks is provided with four shelf units U1, U2, U3 and U4 arranged in that order on the left side of the carrying area R1. The shelf units U1, U2, U3 and U4 have heating units and cooling units stacked up in layers. Different processing units for treating the wafer W before and after the wafer W is processed by the coating unit 31 by a pretreatment and a post-treatment are stacked up, for example, in tow layers. Clean air is circulated through the carrying area R1 thus demarcated by those units to reduce particles floating in the carrying area R1.

Figure 4:
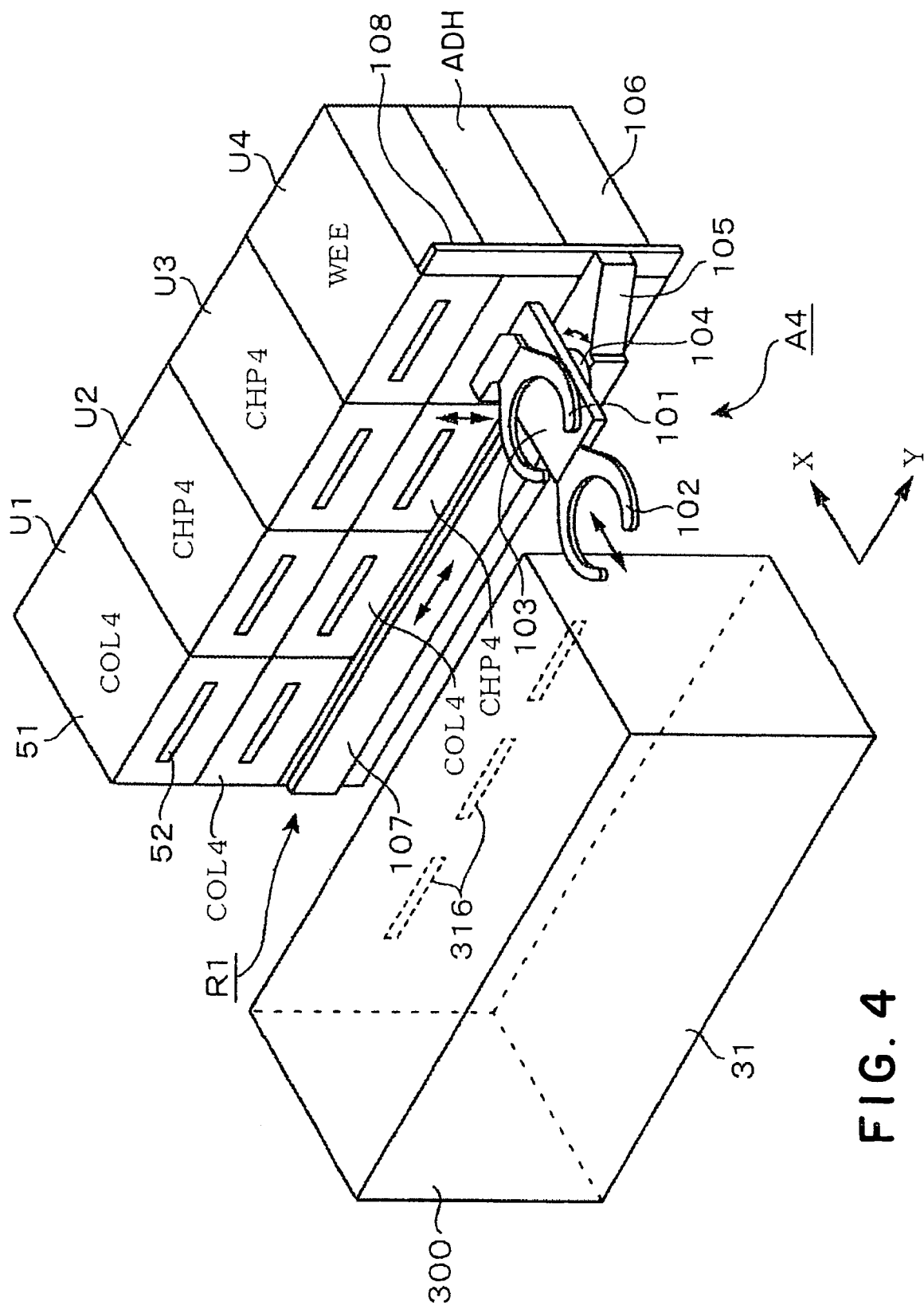
FIG. 4 is a perspective view of a film forming unit, shelf units and a carrying device included in the coating and developing system shown in FIG. 1.

For example, the processing units for carrying out the pretreatment and the post-treatment include cooling units (COL4) for adjusting the temperature of the wafer W to a predetermined temperature before applying a liquid resist to the wafer W, heating units (CHP4) called, for example, a prebaking unit for heating the wafer W after coating a surface of the wafer W with the liquid resist, a hydrophobicity imparting unit (ADH) for enhancing the adhesion of the liquid resist to the wafer W, and a wafer edge exposure device (WEE) for selectively exposing only a peripheral part of the wafer W as shown in FIGS. 4 and 5. The processing units, such as the cooling units (COL4) and the heating units (CHP4) are placed in processing vessels 51, respectively. The processing vessels 51 are stacked up in two layers in each of the shelf unit U1 to U4. A wall, facing the carrying area R1, of each processing vessel 51 is provided with a gate 52 through which the wafer W is carried into and carried out of the processing vessel 51. The hydrophobicity imparting unit processes the wafer W in an HMDS atmosphere. The hydrophobicity imparting unit may be included in any one of the film forming unit blocks B3 to B5.

The main arm A4 operates in the carrying area R1. The main arm A4 is capable of carrying the wafer W from one to another of the processing units of, for example, the shelf units U1 to U4, the coating unit 31, and shelf units U5 and U6. The main arm A4 is movable in horizontal directions and vertical directions, is turnable about a vertical axis and is movable along the Y-axis.

A local area, contiguous with the carrier handling block S1, of the carrying area R1 is a first transfer area R2. As shown in FIGS. 1 and 3, the shelf unit U5 is disposed in the transfer area R2 such that the transfer arm C and the main arm A4 are able to gain access to the shelf unit U5. A first transfer arm D1, namely, a first transfer means, is disposed in the first transfer area R2 to deliver the wafer W to and to receive the wafer W from the shelf unit U5.

Referring to FIG. 3, the shelf unit U5 is provided with two first transfer stages TRS1, two first transfer stages TRS2, two first transfer stages TRS3, two first transfer stages TRS4 and two first transfer stages TRS5 respectively for the unit blocks B1 to B5 to transfer the wafers W from the shelf unit U5 to each of the main arms A1 to A5 and to transfer the wafers W reversely. Thus a first transfer stage group is formed by stacking up first transfer stages in layers. The first transfer arm D1 is movable in horizontal directions and vertical directions to transfer the wafer W to and to receive the wafer from each of the first transfer stages TRS1 to TRS5. The respective first transfer stages TRS1 and the first transfer stages TRS2 of the first unit block B1 and the second unit block B2 transfer the wafer W to and receive the wafer W from the transfer arm C. The first transfer stages TRS1 and TRS2 correspond to transfer stages for the carrier handling block S1. The second unit block B2 is provided with two first transfer stages TRS-F. The transfer stages TRS-F are used only for transferring the wafer W to the processing block S2 by the transfer arm C. The transfer stages TRS-F correspond to transfer stages for the carrier handing block S1 and may be placed in the first unit block B1. The transfer stages TRS-F may be omitted and the transfer stage TRS1 and TRS2 may be used for transferring the wafer W from the transfer arm C to the processing block S2.

A local area, contiguous with the interface block S3, of the carrying area R1 is a second transfer area R3. Referring to FIG. 1, the shelf unit U6 is disposed in the transfer area R3 such that the main arms A1 to A5 are able to gain access to the shelf unit U6. A second transfer arm D2, namely, a second transfer means, is disposed in the second transfer area R3 to deliver the wafer W to and to receive the wafer W from the shelf unit U6.

Figure 6:
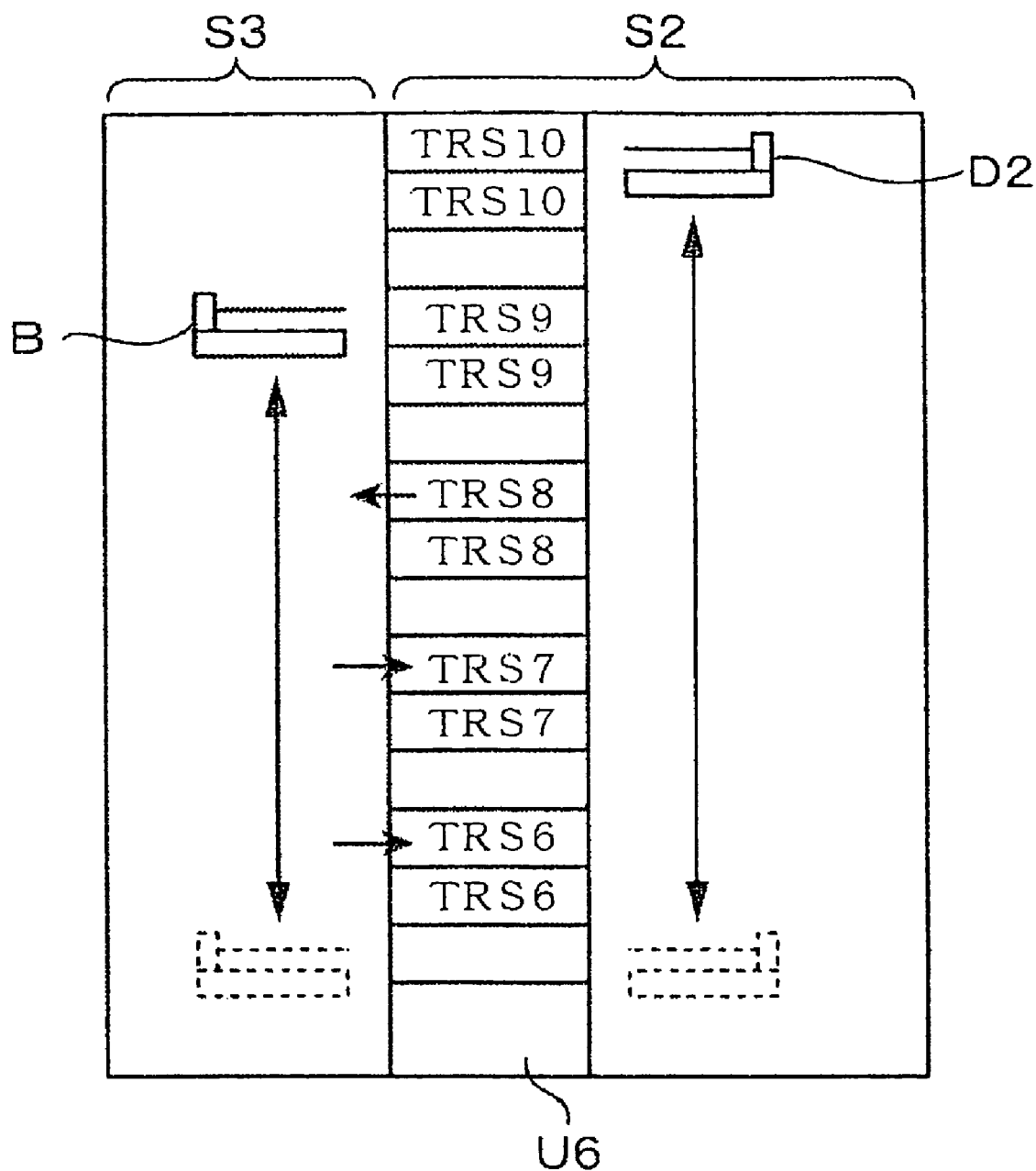
FIG. 6 is a sectional side elevation of an interface block included in the coating and developing system shown in FIG. 1.

Referring to FIGS. 3 and 6, the shelf unit U6 has two second transfer stages TRS6, two second transfer stages TRS7, two second transfer stages TRS8, two second transfer stages TRS9 and two second transfer stages TRS10 respectively for the unit blocks B1 to B5 to transfer the wafer W from the shelf unit U6 to each of the main arms A1 to A5 of the unit blocks B1 to B5 and to transfer the wafer W reversely. Thus a second transfer stage group is formed by stacking up the second transfer stages in layers. The first transfer arm D1 is movable in horizontal directions and vertical directions to transfer the wafer W to and to receive the wafer from each of the second transfer stages TRS6 to TRS10. The wafer W is transferred from the second transfer arm D2 to each of the second transfer stages TRS6 to TRS10 and is transferred reversely. The second transfer arm D2 is capable of moving in horizontal directions and vertical directions. The wafer W can be optionally transferred through each of the first transfer stages TRS1 to TRS5 and TRS-F and the second transfer stages TRS6 to TRS10 from one to another of the unit blocks B1 to B5 stacked in five layers by the first transfer arm D1 and the second transfer arm D2.

Figure 7:
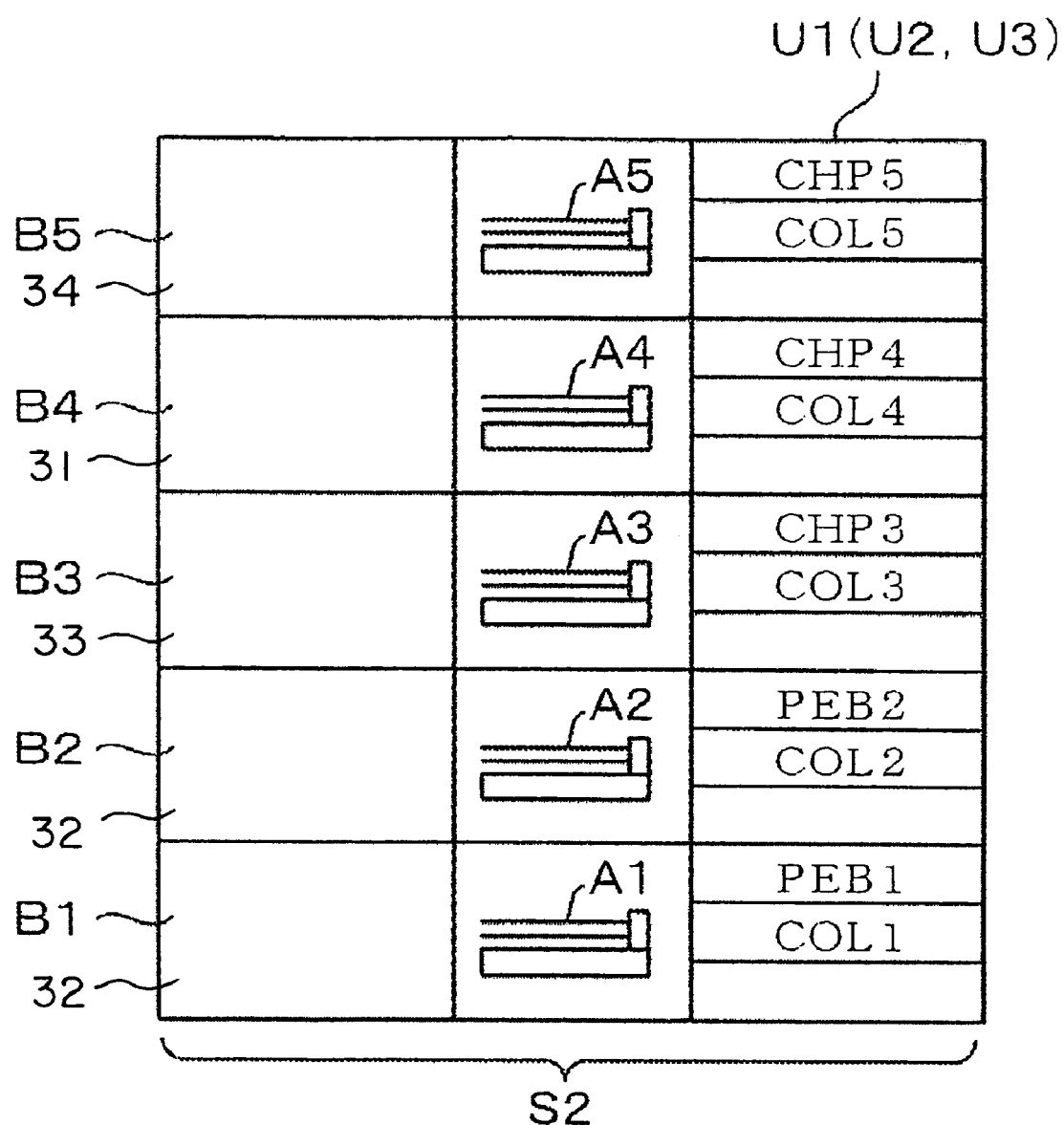
FIG. 7 is a sectional side elevation of unit blocks included in the coating and developing system shown in FIG. 1.

The other unit blocks B will be briefly described with reference to FIGS. 5 and 7. FIG. 5 is a view of the shelf units U1 to U4 taken from the side of the carrying area R1. The DEV layers B1 and B2 are similar in construction and are provided with developing units 32 for processing the wafers W by a developing process. The DEV layers B1 and B2 are similar to the COT layers B4, except that the DEV layers B1 and B2 are provided with heating units PEB1 and PEB2 generally called post-exposure baking units for heating the wafer W after the wafer W has been processed by an exposure process, cooling units COL1 and COL2 to adjust the temperature of the wafer W heated by each of the heating units PEB1 and PEB2 to a predetermined temperature, heating units POST1 and POST2 called post-baking units for heating the wafer W to dry up the wafer W processed by the developing process.

In the DEV layers B1 and B2, the main arms A1 and A2 carries the wafer W from one to another of the first transfer stages TRS1, TRS2 and TRS-F, the second transfer stages TRS6 and TRS7, the developing units 32 and the processing units of the shelf units U1 to U5.

The TCT layer B3 is provided with a first antireflection film forming unit 33 for forming a second antireflection film on the wafer W by a second antireflection film forming process. The TCT layer B3 is similar to the COT layer Br, except the shelf units U1 to U4 of the TCT layer B3 are provided with cooling units COL 3 for cooling the wafer W at a predetermined temperature before subjecting the waver W to the antireflection film forming process and heating units CHP3 for heating the wafer W processed by the antireflection film forming process. In the TCT layer B3, the main arm A3 carries the wafer W from one to another of the first transfer stages TRS3, the second transfer stages TRS8, the first antireflection film forming unit 33 and the processing units of the shelf units U1 to U4.

The BCT layer B5 is provided with a first antireflection film forming unit 34 as a liquid-processing unit for processing the wafer W by a first antireflection film forming process. The BCT layer B5 is similar to the COT layer B4, except that the shelf units U1 to U4 are provided with cooling units COL5 for cooling the wafer W at a predetermined temperature before subjecting the wafer W to the antireflection forming process and heating units CHP5 for heating the wafer W after processing the wafer W by the antireflection film forming process, and are not provided with any wafer edge exposure device WEE. The main arm A5 of the fifth unit block B5 carries the wafer W from one to another of the first transfer stages TRS5, the second transfer stages TRS10, the first antireflection film forming unit 34 and the processing units of the shelf units U1 to U4.

As shown in FIG. 1, each of the heating units CHP3 to CHP5, POST1, POST2, PEB1 and PEB2 is provided with a heating plate 53 and a cooling plate 54 serving also as a carrying arm. The cooling plate 54 carries the wafer W between the main arm A4 and the heating plate 53. Thus a single unit heats and cools the wafer W. Each of the cooling unit COL1 to COL5 is provided, for example, with a water-cooled cooling plate. The cooling plates 54 of the heating units (CHP3 to CHP5, POST1, POST2, PEB1 and PEB2) correspond to cooling units of the present invention.

FIG. 5 shows the layout of those processing units by way of example. The processing units are not limited to the heating units CHP, PEB and POST, the cooling units COL, the hydrophobicity imparting unit ADH and the wafer edge exposure device WEE and may include processing units other than those processing units. The number of the processing units are dependent on processing times required by the processing units.

An exposure system S4 is connected to the shelf unit U6 of the processing block S2 by the interface block S3. The interface block S3 is provided with an interface arm B for carrying the wafer W between the shelf unit U6 of the processing block S2 and the exposure system S4. The interface arm B is a carrying means for carrying the wafer W interposed between the processing block S2 and the exposure system S4. In this embodiment, the interface arm B is able to move in horizontal directions and vertical directions and is able to turn about a vertical axis to carry the wafer W to each of the second transfer stages TRS6 to TRS9 of the first unit block B1 to the fourth unit block B4. In this embodiment, the second transfer stages TRS6 to TRS9 are stages related with the interface block S3.

The interface arm B may be formed so as to carry the wafer W to and receive the wafer from each of the second transfer stages TRS6 to TRS10 of all the unit blocks B1 to B5. When the interface arm B is thus formed, the second transfer stages TRS6 to TRS10 are those related with the interface block S3.

The main arms A (A1 to A5), the first transfer arm D1, the second transfer arm D2, the interface arm B and the liquid-processing units will be briefly explained. As shown in FIG. 4 by way of example, the main arm A is provided with two support arms 101 and 102 on which a peripheral part of the wafer W is seated. The support arms 101 and 102 are able to move individually along a base 103. The base 103 can be turned about a vertical axis by a rotating mechanism 104, can be horizontally moved in directions parallel to the Y-axis along a Y-axis rail 107 attached to a surface, facing the carrying area R1, of a table 106 supporting the shelf units U1 to U4, and can be vertically moved along a vertical rail 108. Thus the support arms 101 and 102 can be moved forward, backward, longitudinally parallel to the Y-axis and vertically and can be turned about a vertical axis. The support arms 101 and 102 can transfer the wafer W to and can receive the wafer W from each of the component units of the shelf units U1 to U6, the first transfer stages TRS1 to TRS5, the second transfer stages TRS6 to TRS10 and the liquid-processing units. The operation of the main arm A is controlled by a controller on the basis of instructions provided by a control unit 6. Order of the respective operations for receiving the wafer W of the support arms 101 and 102 can be optionally controlled by a program.

Figure 8:
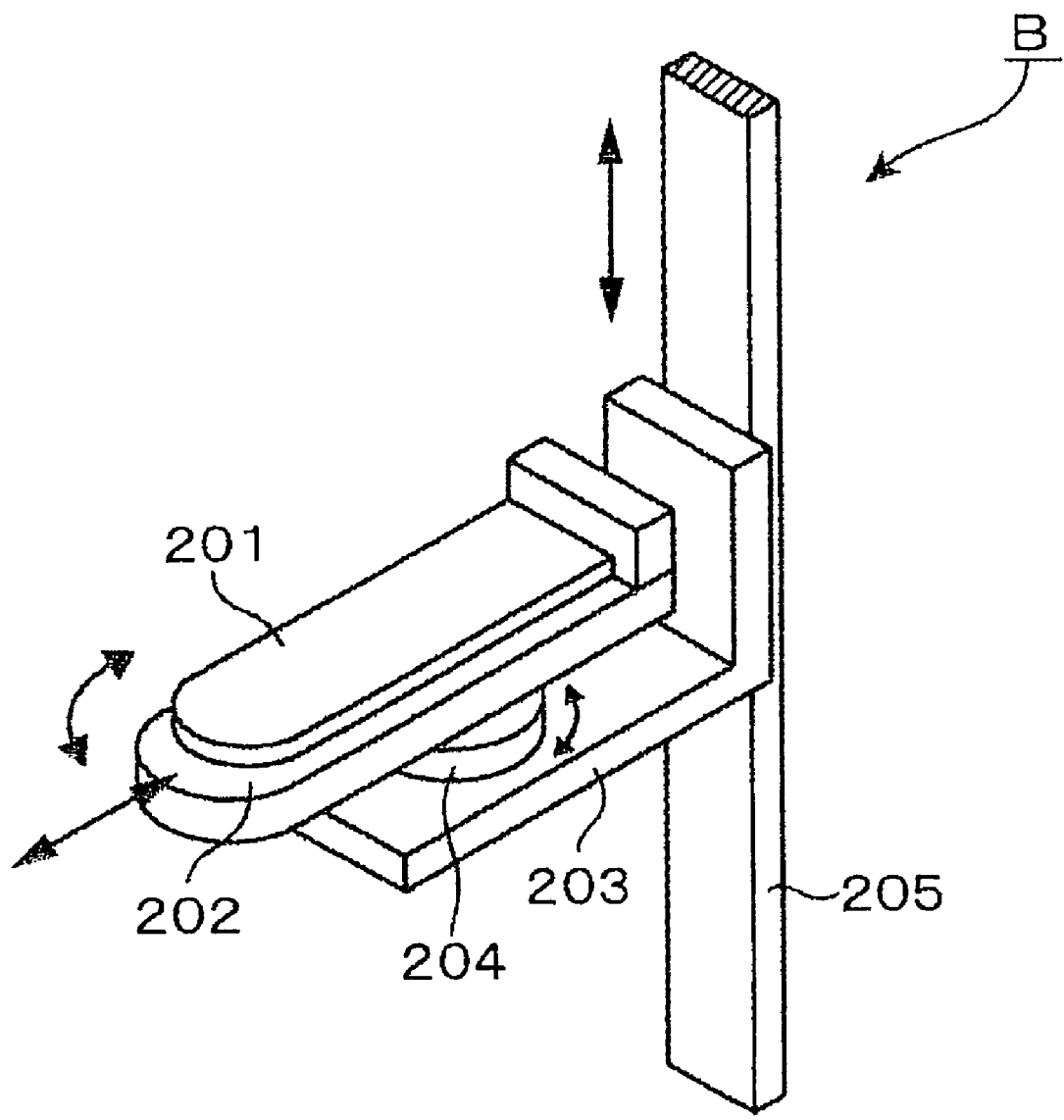
FIG. 8 is a perspective view of an example of an interface arm included in the coating and developing system shown in FIG. 1.

As shown in FIG. 8 by way of example, the interface arm B is provided with a base 202, a support arm 201 on which a central part of the wafer W is seated. The support arm 201 is able to move forward and backward on the base 202. The base 202 is supported on a lifting arm 203 by a rotating mechanism 204 for turning the base 202 about a vertical axis. The lifting arm 203 moves vertically along a vertical rail 205. Thus the arm 201 can be moved forward, backward and vertically and can be turned about a vertical axis to carry the wafer W to and to receive the wafer W from each of the second transfer stages TRS6 to TRS9 of the shelf unit U6.

The first transfer arm D1 and the second transfer arm D2 are similar in construction to the interface arm B, except that the first transfer arm D1 and the second transfer arm D2 are not turnable about a vertical axis. The respective operations of the first transfer arm D, the second transfer arm D2 and the interface arm B are controlled by a controller, not shown, on the basis of instructions provided by the control unit 6.

Figure 9:
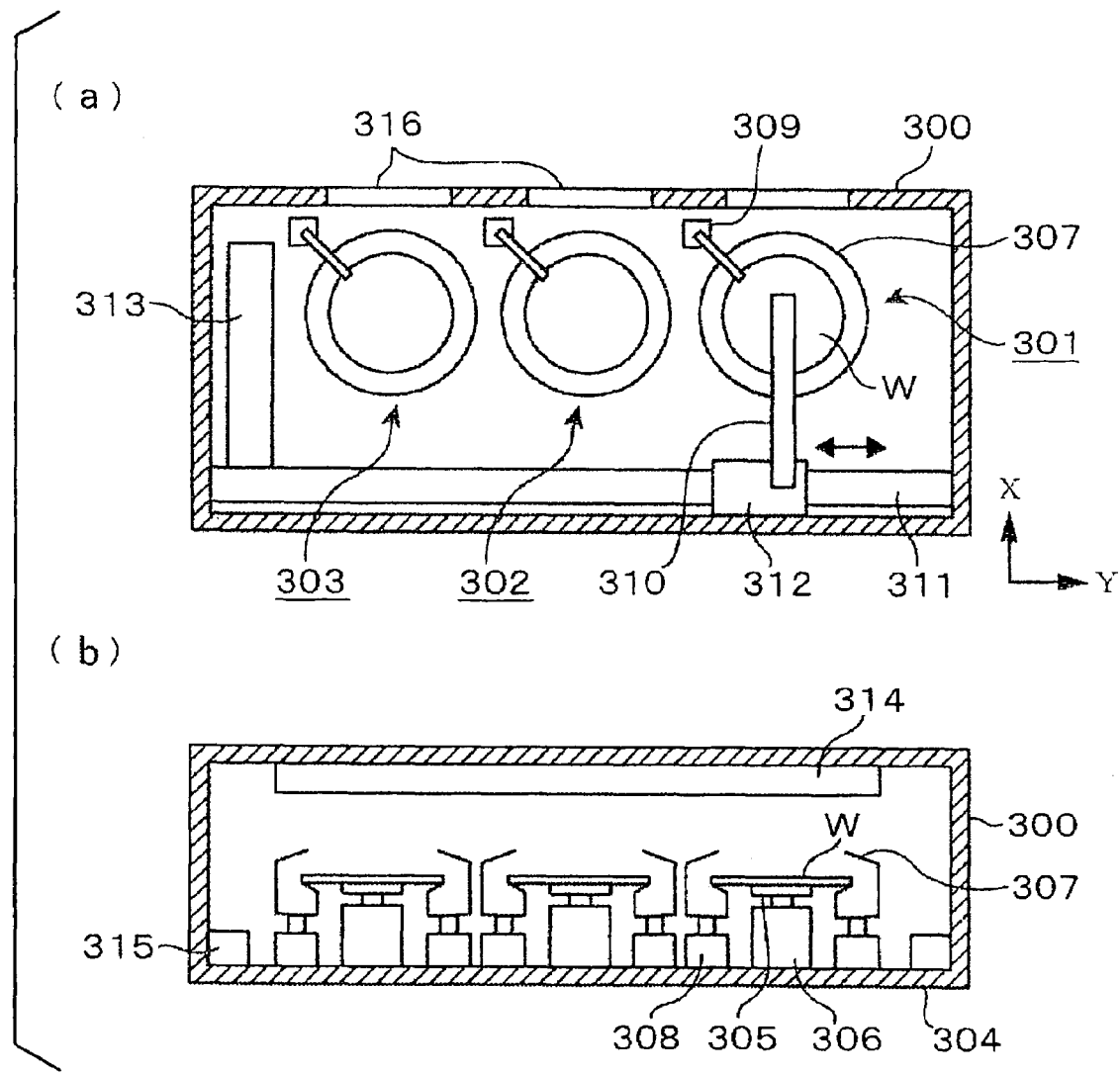
FIGS. 9(a) and 9(b) are a plan view and a longitudinal sectional view, respectively, of a film forming unit included in the coating and developing system shown in FIG. 1.

The coating unit 31 will be briefly described in connection with FIG. 9. The coating unit 31 is provided with three coating devices 301, 302 and 303 placed in a processing vessel 300. The processing devices 301 to 303 are arranged on a base 304 along the Y-axis so as to face the carrying area R1.

The coating devices 301 to 303 are similar in construction and hence only the coating device 301 will be described by way of example. The coating device 301 is provided with a spin chuck 305 capable of holding the wafer W by suction in a horizontal position. The spin chuck 305 can be rotated about a vertical axis by a driving device 306 and can be vertically moved. The spin chuck 305 and the wafer W supported on the spin chuck 305 are surrounded by a cup 307. A drain device 308 provided with a discharge pipe and a drain pipe is connected to the bottom of the cup 307. A side rinsing mechanism 309 pours a rinsing liquid onto a peripheral part of the wafer W supported on the spin chuck 305. The rinsing mechanism 309 can be moved vertically and can be turned about a vertical axis.

A common chemical solution supply nozzle 310 for supplying a chemical solution to the coating devices 301 to 303 can be longitudinally moved along a guide rail 311 extended parallel to the Y-axis between a position on the outer side of the cup 307 of the coating device 301 and a position on the outer side of the cup 307 of the coating device 303, and can be vertically moved by a moving mechanism 312. In this embodiment, the chemical solution supply nozzle 310 pours a liquid resist onto a substantially central part of the wafer W supported on the spin chuck 305 of each of the coating devices 301 to 303. Normally, the chemical solution supply nozzle 310 is held in a home area 313 on the outer side of the coating device 303.

A filter unit 314 is attached to the top wall of the processing vessel 300. A discharge unit 315 is disposed on the bottom wall of the processing vessel 300. A gas in the processing vessel 300 is discharged at a predetermined discharge rate by the discharge unit 315, and a clean gas of a predetermined temperature and a predetermined humidity is supplied through the filter unit 314 into the processing vessel 300 in a down flow to maintain the interior of the processing vessel 300 at a positive pressure higher than the pressure in the carrying area R1 in which the main arm A4 operates. Gates 316 through which the wafer W is carried into and carried out of the processing vessel 300 are formed in a wall, facing the carrying area R1, of the processing vessel 300. The gates 316 are covered with shutters, respectively.

In the coating unit 31, the main arm A4 carries the wafer W through the gate 316 into the processing vessel 300 and places the wafer W on the spin chuck 305 of the desired one of the coating devices 301 to 303. Then, the chemical solution supply nozzle 310 pours a liquid resist onto a central part of the wafer W, the spin chuck 305 rotates to spread the liquid resist radially outward over the surface of the wafer W by centrifugal force to coat the surface of the wafer W with a liquid resist film. Then, the main arm A4 caries out the wafer W coated with the liquid resist film from the coating unit 31.

The three coating devices 301 to 303 of the coating unit 31 are placed in the same processing atmosphere in the processing vessel 300. Therefore, the chemical solution supply nozzle 310 can be used as a single common nozzle for supplying the liquid resist to all the coating devices 301 to 303. Thus the coating unit 31, as compared with a coating unit provided with processing vessels 300 and chemical solution supply nozzles 310 respectively for coating devices 301 to 303, has the less number of parts and needs less floor space.

Since the processing devices 301 to 303 are placed in the same processing atmosphere in the processing vessel 300, a single air supply system and a single air discharge system can be used for all the coating devices 301 to 303, which is effective in reducing component members and necessary floor space. Since the coating devices 301 to 303 are disposed in the same atmosphere, the coating devices 301 to 303 are able to carry out the coating process for coating the wafer with the liquid resist film in the same atmosphere, the coating process susceptible to the processing atmosphere can be carried out in the same mode by all the coating devices 301 to 303.

Since the three coating devices 301 to 303 are mounted on the common base 304, the height adjustment of the support arms 101 and 102 of the main arm A4 relative to the spin chucks 305 can be achieved by adjusting the respective vertical positions of the support arms 101 and 102 relative to the spin chuck of only one of the coating devices 301 to 303. Since the chemical solution supply nozzle 310 is used for supplying the liquid resist to each of the coating devices 301 to 303, the vertical position of the chemical solution supply nozzle 310 needs to be adjusted relative to the spin chuck 305 of only one of the coating devices 301 to 303. Thus time and work necessary for adjusting the vertical position of the chemical solution supply nozzle 310 can be reduced.

The developing unit 32 is substantially similar to the coating unit 31, except that the developing unit 32 has a developer supply area extending along the length of a developer supply nozzle for pouring a developer in a direction parallel to the diameter of the wafer W, and is provided with a cleaning liquid pouring nozzle. A plurality of developing devices are disposed in the common processing vessel 300. The cleaning liquid pouring nozzle is similar to the chemical solution supply nozzle 310 and can be moved along the guide rail 311 and can be vertically moved by a moving mechanism. The cleaning liquid pouring nozzle pours a cleaning liquid onto the wafers W held on the spin chucks 305 of the coating devices 301 to 303.

In the developing unit 32, the main arms A1 and A2 carry the wafer W through the gate 316 into the processing vessel 300 and places the wafer W on the spin chuck 305 of predetermined one of the coating devices (developing devices) 301 to 303. Then, the chemical solution supply nozzle 310 pours a developer onto a central part of the wafer W and the spin chuck 305 supporting the wafer W makes half a turn to pour the developer over the entire surface of the wafer W. After a predetermined time has passed, a cleaning liquid supply nozzle pours a cleaning liquid onto the wafer W to wash away the developer from the wafer W. Then, the wafer W is rotated to dry the wafer W to complete the developing process.

The developing unit 32 may be provided, instead of the cleaning liquid supply nozzle, with a cleaning mechanism which can be moved vertically and can be turned about a vertical axis similarly to the side rinsing mechanism 309 to pour a cleaning liquid onto a central part of the wafer W held on the spin chuck 305.

The first antireflection film forming unit 33 applies a chemical solution for forming an antireflection film to the surface of the wafer W before the liquid resist is applied to the wafer W. The second antireflection film forming unit 34 applies a chemical solution for forming an antireflection film to the surface of a resist film formed on the wafer W. The antireflection film forming units 33 and 34 are the same in construction as the coating unit 31, except that the antireflection film forming units 33 and 34 apply the chemical solutions for forming the antireflection films, respectively, to the wafer W.

The flow of the wafer W in the resist pattern forming system will be described on an assumption that the resist film is sandwiched between the antireflection films. The carrier 20 is delivered to the carrier handling block S1. The transfer arm C takes out the wafer W from the carrier 20 and transfers the wafer W to the first transfer stage TRS-F of the shelf unit U5 of the second unit block B2. The wafer W is transferred via the first transfer stage TRS5 to the main arm A5 of the BCT layer B5 by the first transfer arm D1. Then, in the BCT layer B5, the main arm A5 carries the wafer sequentially to the cooling unit COL5, the first antireflection film forming unit 34, the heating unit CHP5 and the second transfer stage TRS10 of the shelf unit U6 in that order to form the first antireflection film on the wafer w.

Subsequently, second transfer arm D2 carries the wafer W from the second transfer stage TRS10 to the second transfer stage TRS9 to transfer the wafer W to the COT layer B4. Then, the main arm A4 of the COT layer B4 carries the wafer W sequentially to the hydrophobicity imparting unit ADH, the cooling unit COL4, the coating unit 31, the heating unit CHP4 and the first transfer stage TRS4 in that order to form the resist film over the first antireflection film.

Then, the first transfer arm D1 carries the wafer W from the first transfer stage TRS4 to the first transfer stage TRS3 of the TCT layer B3. Then, the main arm A3 of the TCT layer B3 carries the wafer W sequentially to the cooling unit COL3, the first antireflection film forming unit 33, the heating unit CHP3, the wafer edge exposure device WEE and the second transfer stage TRS8 of the shelf unit U6 in that order to form the second antireflection film on the resist film.

Subsequently, the interface arm B carries the wafer W from the second transfer stage TRS8 to the exposure system S4 to subject the wafer W to a predetermined exposure process. After the exposure process has been completed, the interface arm B carries the wafer W to the second transfer stage TRS6 (TRS7) of the shelf unit U6 to deliver the wafer W to the DEV layer B1 (DEV layer B2). Then, the main arm A1 (main arm A2) carries the wafer W from the second transfer stage TRS6 (TRS7) to the heating unit PEB1 (PEB2), the cooling unit COL1 (COL2), the developing unit 32, the heating unit POST1 (POST2) of the DEV layer B1 (DEV layer B2) to process the wafer W by a predetermined developing process. After the developing process has been completed, the wafer is delivered to the first transfer stage TRS1 (TRS2). Then, the transfer arm C carries the wafer W to return the wafer W to the carrier 20 placed on the carrier support table 21 of the carrier handling block S1.

The resist pattern forming system is provided with the control unit 6 including a computer for managing recipes for the operations of the processing units, managing carrying recipes for carrying the wafer W along carrying routes and controlling the processing operations of the processing units and the operations of the main arms A1 to A5, the transfer arm C, the first transfer arm D1, the second transfer arm D2 and the interface arm B. The control unit 6 controls the unit blocks B1 to B5 to carry and process the wafer W.

The carrying recipe for the flow of the wafer W specifies a carrying route along which the wafer W is carried in the unit block. Carrying recipes are produced exclusively for the unit blocks B1 to B5 according to the types of films formed in the unit blocks B1 to B5. The carrying recipes for the unit blocks B1 to B5 are stored in the control unit 6.

The wafer W is carried in one of a plurality of carrying modes specific to the types of films. There are a carrying mode of carrying the wafer W to all the unit blocks B1 to B5, a carrying mode of carrying the wafer W to the unit blocks (DEV layer B1, DEV layer B2) which carry out the developing process, the unit block COT layer B4) which carries out the liquid resist application process and the unit block (BCT layer B5) which carries out the first antireflection film forming process, a carrying mode of carrying the wafer to the unit block (DEV layer B1, DEV layer B2) which carries out the developing process, the unit block (COT layer B4) which carries out a liquid resist application process, and a unit block (TCT layer B3) which carries out the second antireflection film forming process, and a carrying mode of carrying the wafer W only to the unit block (DEV layer B1, DEV layer B2) which carries out the developing process. A mode selector included in the control unit 6 selects the unit blocks to which the wafer W is to be carried on the basis of the type of a film to be formed and selects the optimum ones of the plurality of carrying recipes prepared for the selected unit blocks. Thus the proper unit blocks for forming the specified film are selected, the arms and the processing units of the unit blocks are controlled to carry out a series of processes.

In this resist pattern forming system, the unit blocks respectively for forming different-types of films, and the unit blocks for carrying out the developing process are disposed in separate areas, respectively, and those unit blocks are provided individually with the main arms A. Therefore, load on each of the main arms A is small, the carrying efficiency of the main arms A is improved and, consequently, the throughput of the resist pattern forming system can be increased.

The unit block (COT layer B4) exclusively for forming the resist film, the unit block (BCT layer B5) exclusively for forming the first antireflection film, the unit block (TCT layer B3) exclusively for forming the second antireflection film are stacked in layers. Therefore, a floor space in the processing block S2 needed for forming the two antireflection films over and under the resist film is equal to that needed in the processing block S2 for forming only the resist film. Consequently, space in which the resist film forming system is installed can be reduced.

Since the COT layer B4, the BCT layer B5 and the TCT layer B3 are individual unit blocks for forming the film, it is possible to cope with a case where the antireflection film is to be formed and a case where any antireflection film is not formed by selecting the necessary unit blocks from the DEV layers B1 and B2 (or either of the DEV layer B1 and the DEV layer B2), the BCT layer B5, the COT layer B4 and the TCT layer B3. Since the unit blocks to be used have the same carrying routes, respectively, the carrying programs are not complicated, the carrying operation for carrying the wafer W can be controlled by a simple carrying program and the software is simplified when different films of different lots are formed by the one and the same coating and developing system.

As mentioned above, the unit blocks to be used for processing the wafer W among the unit blocks B1 to B5 are determined by selecting the unit blocks and the carrying recipes for a desired film from the unit blocks for forming films stored in the control unit 6 and the carrying recipes for the unit blocks.

For example, when any antireflection film is not formed, only the DEV layers B1 (B2) and the COT layer B4 are selected, and the wafer is carried from the carrier 20, along a carrying route sequentially passing the transfer arm C, the first transfer stage TRS-F of the shelf unit U5, the first transfer arm D1, the first transfer stage TRS4, the main arm A of the COT layer B4, the hydrophobicity imparting unit ADH, the cooling unit COL4, the coating unit 31, the heating unit CHP4, the second transfer stage TRS9 of the shelf unit U6, the interface arm B, the exposure system S4, the interface arm B, the second transfer stage TRS6 (TRS7) and the DEV layer B1 (B2) in that order.

When only the resist film and the antireflection film underlying the resist film are to be formed, only the DEV layer B1 (B2), the BCT layer B5 and the COT layer B4 are selected, and, for example, the wafer W is carried from the carrier 20 along a carrying route sequentially passing the transfer arm C, the first transfer stage TRS-F of the shelf unit U5, the first transfer arm D1, the first transfer stage TRS5, the main arm A of the BCT layer B5, the cooling unit COL5, the first antireflection film forming unit 34, the heating unit CHP5, the second transfer stage TRS10, the second transfer arm D2, the second transfer stage TRS9, the main arm A4 of the COT layer B4, the hydrophobicity imparting unit ADH, the cooling unit COL4, the coating unit 31, the heating unit CHP4, the second transfer stage TRS9 of the shelf unit U6, the interface arm B, the exposure system S4, the interface arm B, the second transfer stage TRS6 (TRS7) and the developing layer B1 (B2) in that order.

When only the resist film and the antireflection film overlying the resist film are to be formed, only the DEV layer B1 (B2), the COT layer B4 and the TCT layer B3 are selected, and, for example, the wafer W is carried from the carrier 20 along a carrying route sequentially passing the transfer arm C, the first transfer stage TRS-F of the shelf unit U5, the first transfer arm D1, the first transfer stage TRS4 and the main arm A4 of the COT layer B4. A carrying route along which the wafer W is carried in the COT layer B4 and a carrying route along which the wafer W is carried after the wafer W has been processed by the COT layer B$ are the same as those mentioned above.

The carrying routes respectively in the selected unit blocks (the COT layer B4, the BCT layer B5 and the TCT layer B3) for forming the films are the same. Therefore, when different films are to be formed, it is necessary only to select the proper unit blocks to be used and to carry the wafer W to the selected unit blocks. Therefore, the carrying program is simple.

Since the transfer arms and the transfer stages for delivering the wafer W to and receiving the wafer W from the unit blocks B1 to B5 stacked in five layers are installed in both the area in the processing block S2 contiguous with the carrier handling block S1 and in the area contiguous with the interface block S3, the wafer W processed by the film forming unit blocks B3 to B5 can be carried to the next layer by using either of the first transfer arm D1 and the second transfer arm D2. Thus the degree of freedom of carrying route selection is large.

When the antireflection films are formed respectively over and under the resist film, the wafer W may be carried via the first transfer stage TRS5 of the shelf unit U5 to the COT layer B4 by the first transfer arm D1 or may be carried via the second transfer stage TRS10 of the shelf unit U6 to the COT layer B4 by the second transfer arm D2 after the antireflection film has been formed by the BCT layer B5.

The large degree of freedom of carrying route selection facilitates designing carrying programs for the main arms A1 to A5 of the unit blocks B1 to B5, the first transfer arm D1 and the second transfer arm D2. Since the wafers W processed by the film forming unit blocks B3 to B5 can be delivered to the next layer by either of the first transfer arm D1 and the second transfer arm D2, load on each of the transfer arms D1 and D2 is small and hence the throughput of the coating and developing system can be increased.

Since the coating and developing system is provided with the transfer stages STIR to TRS10, and the transfer arms D1 and D2 capable of accessing the transfer stages STIR to STIR, the carrying system for carrying the wafer W between one and another of those unit blocks is simple in construction and hence carrying programs can be simplified.

Since the film forming unit blocks differ from each other only in the types of the chemical solutions used by the liquid-processing units, chemical solution supply lines, drain lines and discharge lines can be collectively laid, cables of electric systems can be collectively laid, pipes and cables can be simply arranged and hence the coating and developing system can be easily assembled. Consequently, the coating and developing system can be efficiently manufactured in a short time at low manufacturing costs.

When the BCT layer B5, the COT layer B4 and the TCT layer B3 are formed of the similar unit blocks, namely, the similar liquid-processing units, the heating units and the cooling units, and provided with the main arms of the same layout and differ from each other only in the types of chemical solutions used by the liquid-processing units, the coating and developing system can be built by assembling unit blocks of the same design. The manufacture of the coating and developing system including the unit blocks of the same design, as compared with a coating and developing system including unit blocks of different designs, facilitates manufacturing work, reduces faulty manufacturing work, increases the throughput of a coating and developing system manufacturing line and reduces the manufacturing costs of the coating and developing system. Use of many common parts for building the coating and developing system is effective in reducing manufacturing costs. When the BCT layer B5, the COT layer B4 and the TCT layer B3 are built by assembling the same unit blocks, faulty manufacturing work can be reduced, accuracy increases and adjustment is facilitated, and time necessary for adjustment can be reduced.

Even if any one of the film forming unit blocks becomes inoperative due to accidental troubles, another film forming unit block can be used to form a film.

Figure 10:
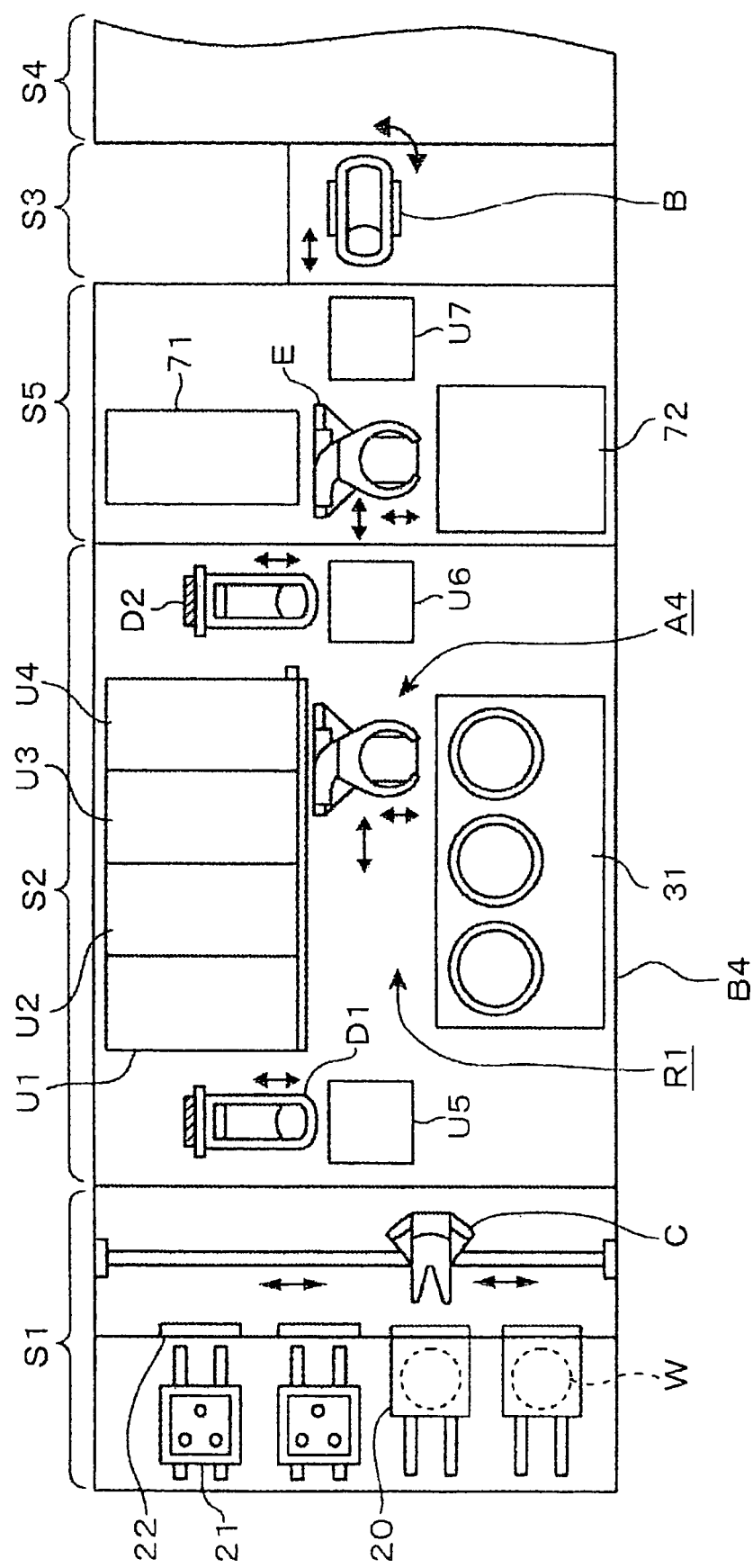
FIG. 10 is a plan view of a coating and developing system in a second embodiment according to the present invention.

A coating and developing system in a second embodiment according to the present invention will be described with reference to FIG. 10. This coating and developing system is combined with an exposure system S4 which carries out an immersion exposure process which forms a liquid layer on a surface of the wafer W, includes an auxiliary block S5 interposed between a processing block S2 and an interface block S3, and is provided additionally with a film forming unit block including a water-repellent protective film forming unit, for forming a water-repellent protective film on a second antireflection film, disposed, for example, on a COT layer B4 or a TCT layer B3. The water-repellent protective film forming unit is a liquid-processing unit to deal with immersion exposure. The water-repellent protective film forming unit forms a protective film capable of preventing a resist film from being impregnated with a liquid for immersion exposure. The unit block including the water-repellent protective film forming unit may be provided with a protective film removing device for removing the protective film after exposure and a cleaning device for removing particles from the wafer W before and after exposure and for removing matters that will affect adversely to exposure.

Installed in the auxiliary block S5 are an inspection unit 71 for inspecting the wafer between a film forming process and an exposure process and between the exposure process and a developing process, a cleaning unit 72 for cleaning the wafer W by a cleaning process after the immersion exposure process, a shelf unit 7 built by stacking up transfer stages TRS from which an interface arm B included in an interface block S3 receives the wafer W and to which the interface arm B delivers the wafer W, a third transfer arm E for carrying the wafer W from one to another of transfer stages TRS6 to TRS8 included in a shelf unit U6 in a processing block S2, the inspection unit 71, the cleaning unit 72 and parts of a shelf unit U7. The inspection unit 71 and the cleaning units 72 may be layered structures. Only cleaning units 72 or inspection units 71 may be disposed on the opposite sides of the third transfer arm E. The arrangement of those components is optional.

The third transfer arm E is capable of moving in horizontal directions and vertical directions and of turning about a vertical axis. The inspection between the film forming process and the exposure process includes measuring the thickness of the film formed on the wafer W and search for foreign matters on the wafer. The inspection between the exposure process and the developing process includes a photomask alignment inspection. The auxiliary block S5 may be provided with an alignment mark detector for detecting an alignment mark formed on a substrate and a film removing unit for removing part of a film by a laser process.

At least one of functional units and devices is installed in the auxiliary block S5. The functional units and devices include a surface inspection unit for inspecting the surface of the wafer W, a film thickness measuring unit for measuring the thickness of a film formed on the wafer W, an irregularity detecting device for detecting irregularities in a liquid resist film, a cleaning unit for cleaning the wafer W before and/or after the developing process, a defocus inspection device for inspecting a pattern for dislocation, a development defects detecting device for detecting defects in the film due to faulty development, a particle counting device for counting particles adhering to the wafer W, a comet detecting device for detecting comets formed in a liquid resist film by bubbles or foreign matters contained in the liquid resist applied to the wafer W, a splash-back detecting device for detecting the solvent of the liquid resist splashed from the liquid resist and adhered to the wafer W, a common defect detecting device for detecting defects of the same shape appearing at the same positions on the surfaces of wafers W, a scum detecting device for detecting residual resist remaining on the wafer W after the developing process, a defective resist film and faulty development detecting device for detecting defects in the resist film and/or for detecting faulty development (defect detecting device), a line width measuring device for measuring the width of the lines of a patterned resist film, and a photomask alignment inspecting device for inspecting the accuracy of alignment of a photomask with the wafer W subjected to the exposure process.

Defocus inspection by the defocus inspection device finds out a defocus condition of the exposure system through the comparison of a pattern formed on the wafer W with a registered correct pattern. For example, the line width measuring device decides whether or not exposure and exposure time in which the exposure system processed the resist film formed on the wafer W are proper through the comparison of a measured pattern with a previously registered correct pattern. For example, the photomask alignment inspecting device decides whether or not exposure and exposure time in which the exposure system processed the resist film formed on the wafer W are proper through the comparison of a pattern of a specific part which can be compared with a pattern of a lower layer with a previously registered correct pattern.

When the wafer W is to be subjected to a cleaning process after exposure, the wafer W is carried sequentially, for example, to a carrier handling block S1, a BCT layer B5, a COT layer B4, a TCT layer B3 and a unit block for forming a water-repellent protective film in that order. Subsequently, the wafer W is carried sequentially, for example, to a second transfer stage in the shelf unit U6, a second transfer arm D2, a second transfer stage TRS8, a third transfer arm E in the auxiliary block S5, a transfer stage in the shelf unit U7, an interface arm B in the interface block S3, a transfer stage and the exposure system S4 in that order. The wafer W processed by an exposure process is carried sequentially to the interface arm B in the interface block S3, a transfer stage in the shelf unit U7 of the auxiliary block S5, the third transfer arm E, the cleaning unit 72, the third transfer arm E, a transfer stage TRS6 (TRS7) in the shelf unit U6, a main arm A1 (A2) and a DEV layer B1 (B2) in that order.

One out of a predetermined number of wafers W is subjected to predetermined inspections. For example, when the wafer W is to be inspected after forming a film thereon, the wafer W is inspected in the auxiliary block S5 before delivering the wafer W to the exposure system S4. When the wafer W is to be inspected after exposure, the wafer W returned from the exposure system S4 to the auxiliary block S5 is inspected. When the wafer W is to be inspected after the developing process, the wafer processed by the developing process in the processing block S2 is transferred to the auxiliary block S5 for inspection.

The water-repellent protective film is formed on the second antireflection film to repel the liquid by the protective film during immersion exposure and to make the liquid hardly able to stay on the surface of the wafer W. For example, the protective film is formed on the surface of the wafer w and on a peripheral part of the back surface of the wafer W. The wafer W processed by the exposure process is subjected to a cleaning process to remove the protective film in order to avoid producing particles by the protective film fallen off the wafer W. For example, a chemical solution for removing the protective film is poured on the surface and the peripheral part of the back surface of the wafer W to remove the protective film, and the chemical solution wetting the wafer W is washed off by a cleaning liquid.

In the second embodiment, the auxiliary block S5 provided with the inspection unit and the cleaning unit is interposed between the processing block S2 and the interface block S3. Therefore, for example, the wafer W can be inspected and cleaned when the wafer W is transferred from the processing block S2 to the interface block S3 before the wafer W is subjected to the exposure process after being processed by the film forming process and/or the wafer W can be inspected and cleaned after the exposure process before subjecting the wafer W to the developing process. The complexity of the carrying program can be suppressed even if the wafer W is subjected to inspection and cleaning in the foregoing mode.

The second embodiment may form the protective film on the resist film when any antireflection film is not formed on the wafer W, the wafer W may be subjected to the cleaning process before or after the exposure process or before and after the exposure process. When any protective film is not formed on the wafer W, the cleaning unit 72 is used to clean the wafer W.

According to the present invention, the wafer W may be processed only by the developing unit blocks B1 and B2. The coating and developing system may be provided with only a single developing unit block. When the film forming unit blocks TCT layer, the COT layer and the BCT layer are stacked upward in that order, the TCT layer and the COT layer for forming films immediately before the wafer W is subjected to the exposure process are near the DEV layer for processing the wafer W processed by the exposure process. Consequently, the working range of the interface arm B is narrowed. However, the film forming unit blocks, namely, the BCT layer, the COT layer and the TCT layer, may be stacked upward in that order.

According to the present invention, the transfer stages of the shelf unit U5 accessible by the transfer arm C are not limited to those of the DEV layer B1 and the DEV layer B2, and may be transfer stages via which the wafer W can be transferred from the transfer arm C to at least one of the stacked unit blocks and can be transferred reversely. The wafer W may be carried between each of the unit blocks B1 to B5 and the interface block S3 by the second transfer arm D2 via a second transfer stage TRS exclusively for carrying the wafer W between the interface arm B and the shelf unit U6. The wafer W may be carried from and to the modules of the DEV layers B1 and B2 by a common main arm A.

Each unit block may be provided with one or some transfer stages TRS of each of the shelf units U5 and U6 and the transfer stages may have a cooling function. The unit blocks, which receive the wafer W from and send out the wafer W to the carrier handling block S1 and the interface block S3, may be provided with exclusive carrying devices for carrying the wafer W between the transfer arm C and the interface arm B or between the shelf units U5 and U6 in addition to the main arms A. The shelf units U5 and U6 may be provided with modules other than the transfer stages, such as a cooling unit. The stacked unit blocks B1 to B5 of the processing block S2 may be provided with an inspection unit as a processing unit. For example, the unit blocks B1 to B5 may be provided with a film thickness measuring device instead of the wafer edge exposure devices WEE of the COT layer B4 and the TCT layer B3. The DEV layers B1 and B2 may be provided with a pattern alignment inspecting device and a development defect detecting unit for inspecting the wafer W after the developing process. The unit blocks may be provided with inspection units disposed on the opposite sides of the carrying passage in which the main arm A operates. The processing block S2 may be provided with a unit block exclusively for inspection units.

The main arm A may be used in common for carrying the wafer W by the modules of the DEV layers B1 and B2. The present invention is applicable to coating and developing systems for processing substrates other than semiconductor wafers, such as glass substrates for liquid crystal displays (LCD substrates).

A resist pattern forming system in a third embodiment according to the present invention has the following construction illustrated in FIGS. 11 to 16. The resist pattern forming system has an auxiliary block S5 and an interface block S3. The auxiliary block S5 is provided with water-repellent protective film forming units (ITC) (hereinafter, referred to as "protective film forming units (ITC)"), and water-repellent protective film removing units (ITR) (hereinafter referred to as "protective film removing units (ITR)"). The protective film forming unit (ITC) forms a protective film on a resist film to prevent the penetration of a liquid into the resist film. The protective film removing unit (ITR) removes the water-repellent protective film formed on the resist film. The interface unit S3 is provided with cleaning units RD for cleaning a wafer before and after immersion exposure.

Immersion exposure will be briefly explained. Immersion exposure exposes a surface of a substrate coated with a liquid layer to achieve exposure in a high resolution. Immersion exposure utilizes the characteristic of light that the wavelength of light shortens in water. For example, the wavelength of ArF light shortens from 193 nm to 134 nm in pure water.

When a liquid layer is formed on the surface of a resist film for immersion exposure, the resist is likely to be eluted by the liquid layer, an eluate containing the resist eluted by the liquid layer is likely to remain on the wafer W, and small liquid drops are likely to remain on the surface of the wafer W after the liquid layer has been removed from the wafer W after the completion of an exposure process. If the eluates containing the resist or the liquid drops remain on the wafer W, particles that cause defects may be produced, particles produced from the eluate containing the resist when the wafer W is subjected to a heating process after the exposure process sticks to the wafer W or melts. Consequently, the width of lines of a pattern is affected, the wafer W is heated irregularly due to the liquid drops remaining on the wafer w by the heating process following the exposure process, the heating process cannot heat the wafer W in intrasurface uniformity or liquid drops interact with air and form watermarks on the surface of the wafer W.

A water-repellent protective film is formed on the wafer W by the protective film forming unity (ITC) before the wafer W coated with a resist film is subjected to an immersion exposure process. When the resist film coated with the protective film is subjected to a developing process, the developer is unable to resolve necessary parts of the resist film. Therefore, the protective film needs to be removed before the developing process. The protective film is removed by the protective film removing unit (ITR). The cleaning unit (RD) cleans the surface of the wafer W after the wafer W has been processed by the immersion exposure process to ensure that the eluate containing the resist and drops of the liquid used for immersion exposure are removed completely.

The layout of the components of the resist pattern forming system will be described. A carrier block S1 and a processing block S2 are substantially similar to those of the resist pattern forming system shown in FIG. 1, except that unit blocks B1 to B5 are stacked in different order.

Figure 12:
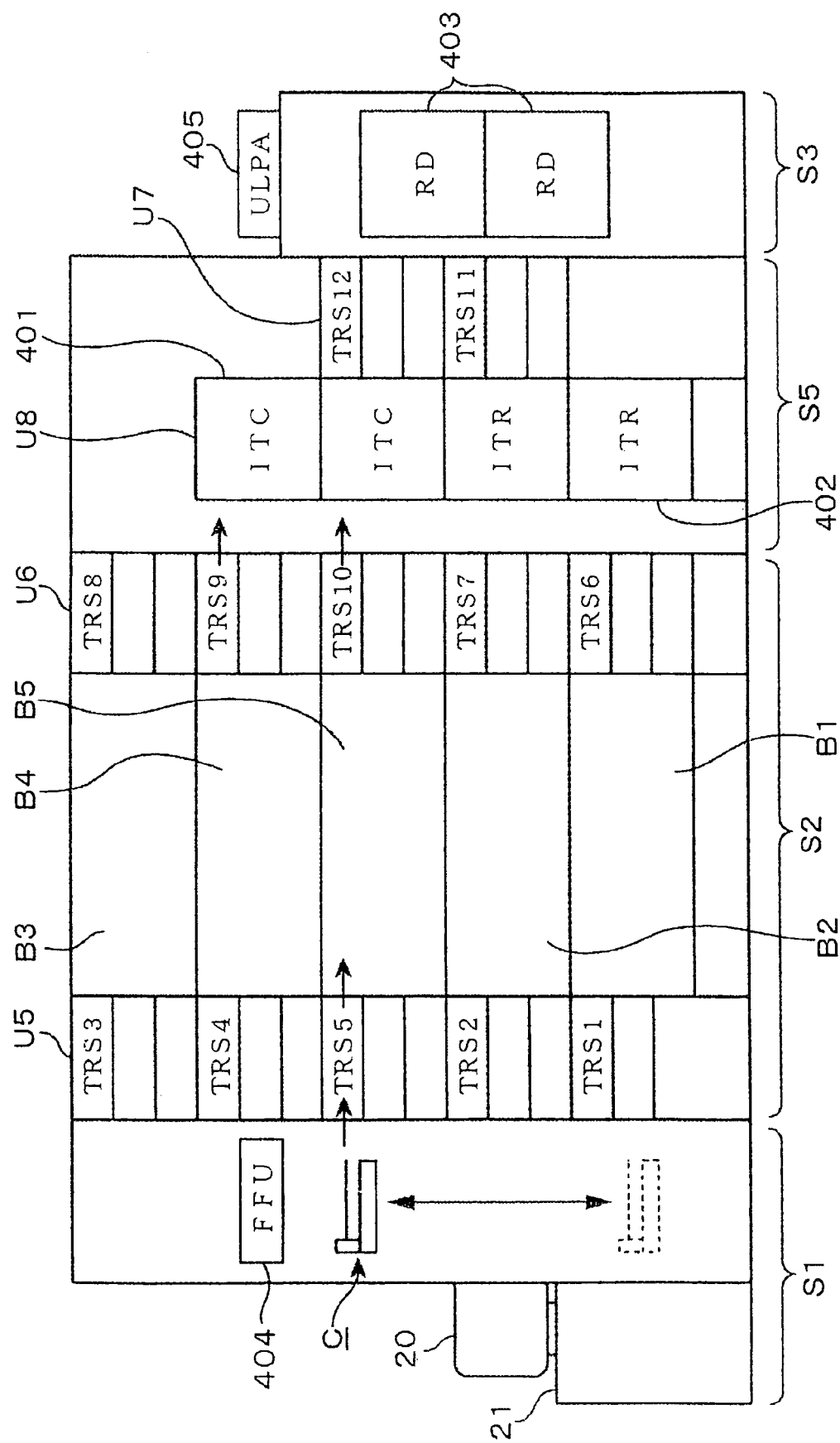
FIG. 12 is a sectional side elevation of the coating and developing system.

Differences from the resist pattern forming system shown in FIG. 1 will be described. Referring to FIG. 12, the processing block S2 is provided with two DEV layers B1 and B2, a BCT layer B5, a COT layer B4 and a TCT layer B3 stacked up in that order. A wafer W is transferred from the carrier block S1 directly to the BCT layer B5 through a transfer stage TRS5 included in the BCT layer B5. A wafer W is transferred to an auxiliary block S5 from the processing block S2 through a transfer stage TRS9 of the COT layer B4 or a transfer stage TRS10 of the BCT layer B5. In FIG. 12, only first transfer stages TRS1 to TRS5 of a shelf unit U5 respectively for the unit blocks B1 to B5 and only second transfer stages TRS6 to TRS10 of a shelf unit U6 respectively for the unit blocks B1 to B5 are shown for convenience.

In the auxiliary block S5 adjacent to the processing block S2, fourth transfer arms F are disposed in a central part of the auxiliary block S5, and shelf units U7, U8 and U9 are arranged around the fourth transfer arms F, for example, on the right and the left side, as viewed from the side of the carrier block S1, of the fourth transfer arms F. The shelf unit U7 is provided in a layered arrangement with transfer stages TRS11 and TRS12 for transferring a wafer W to and receiving a wafer W from an interface arm B included in the interface block S3. The shelf unit U8 is provided in a layered arrangement with, for example, protective film forming units (ITC) and protective film removing units (ITR). The shelf unit U9 is provided in a layered arrangement with units of heating and cooling systems including an inspection unit 71, a cooling unit (COL) and a heating unit (CHP).

Positional relations among the component units of the shelf units U7 to U9 will be described with reference to FIGS. 12 and 13. For example, the shelf unit U8 is provided in a layered arrangement with two protective film removing units (ITR) 402 and two protective film forming units (ITC) 401 stacked on the two protective removing units (ITR) 402. The lower two protective film removing units (ITR) 402 correspond to the two DEV layers B1 and B2 of the processing block S2, respectively. The upper two protective film forming units (ITC) correspond to the BCT layer B5 and the COT layer B4 of the processing block S2, respectively.

The transfer stages TRS11 and TRS12 of the shelf unit U7 correspond to either of the protective film removing units 402 and either of the protective film forming units 401, respectively. In this embodiment, the transfer stage TRS11 corresponds to the upper protective film removing unit 402 and the transfer stage TRS12 corresponds to the lower protective film forming unit 401. The transfer stage TRS12 is used for transferring a wafer W from the auxiliary block S5 to the interface block S3, and the transfer stage TRS11 is used for transferring a wafer W from the interface block S3 to the auxiliary block S5.

Figure 13:
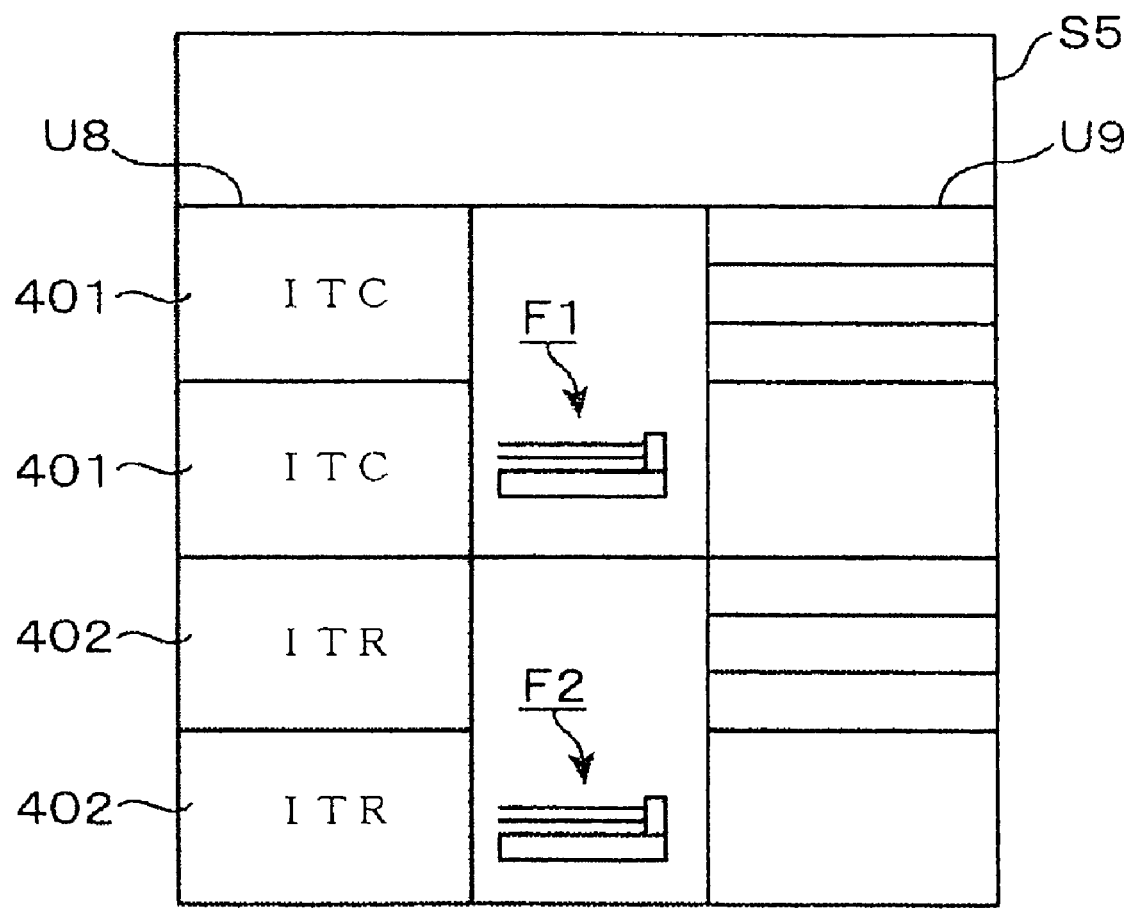
FIG. 13 is a sectional view of an auxiliary block included in the coating and developing system taken from the side of an interface block.

As shown in FIG. 13 by way of example, the fourth transfer arms F are an upper transfer arm F1 and a lower transfer arm F2. The upper transfer arm F1 carries a wafer W between the BCT layer B5 and the COT layer B4 of the processing block S2, and carries a wafer W from and to the shelf units U7 to U9 of the auxiliary block S5. For example, the upper transfer arm F1 carries a wafer W from and to the transfer stages TRS9 and TRS10 of the shelf unit U6 of the processing block S2, the protective film forming unit (ITC) of the shelf unit U8, the transfer stage TRS12 of the shelf unit U7, and the corresponding parts of the shelf unit U9

The lower transfer arm F2 carries a wafer W between the DEV layers B1 and B2 of the processing block S2 and carries a wafer from and to the parts of the shelf units U7 to U9 of the auxiliary block S5. For example, the lower transfer arm F2 carries a wafer W from and to the transfer stages TRS6 and TRS7 of the shelf unit U6 of the processing block S2, the protective film removing units (ITR) of the shelf unit U8, the transfer stage TRS11 of the shelf unit U7, and the corresponding parts of the shelf unit U9.

The transfer arms F1 and F2 are similar in construction to, for example, the main arms A1 to A5. The transfer arms F1 and F2 are movable in directions along the Y-axis along Y-axis rails 107 set on a base, not shown, on which the shelf unit U9 is installed and in forward and backward directions, and are turnable about a vertical axis. In the interface block S3, two cleaning units (RD) 403 for cleaning a wafer after immersion exposure are stacked one on top of the other at positions to which the interface arm B is accessible.

A filter unit (FFU) 404 is disposed above an operating space in which the transfer arm C of the carrier block S1 operates. The filter unit 404 supplies a clean gas of a desired temperature and a desired humidity at a predetermined flow rate into the carrier block S1 to produce a down flow of the clean gas in the operating space of the transfer arm C. A ULPA filter 405 is disposed above the interface block S3. The ULPA filter 405 supplies clean air not containing dust and the like into the interface block S3. The foregoing embodiments may be provided with a filter unit 404 and a ULPA filter 405 installed respectively in the carrier block S1 and the interface block S3.

Figure 14:
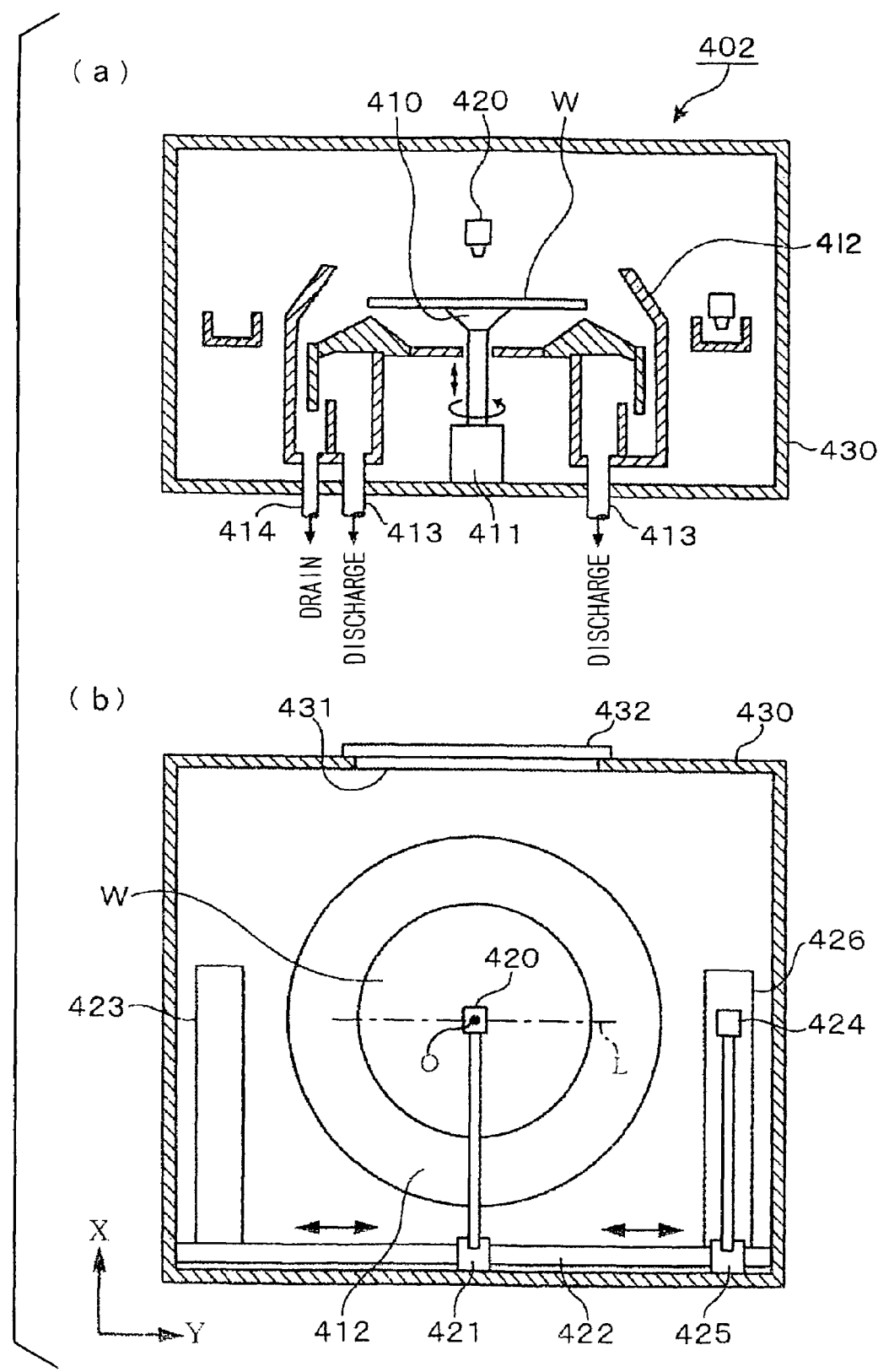
FIGS. 14(a) and 14(b) are a longitudinal sectional view and a plan view, respectively, of a protective film removing unit included in the coating and developing system.

The construction of the protective film forming unit 101, the protective film removing unit 402 and the cleaning unit 403 will be described. Since the protective film forming unit 101, the protective film removing unit 402 and the cleaning unit 403 are substantially similar in construction, the protective film removing unit 402 will be described by way of example with reference to FIG. 14. Referring to FIG. 14, a spin chuck 410, namely, a substrate holding member, holds a wafer W in a horizontal position by suction. A drive unit 411 drives the spin chuck 402 for rotation about a vertical axis and vertical movement. A cup 412 surrounds the spin chuck 410 and a wafer W held on the spin chuck 410. A drain unit including a discharge pipe 413 and a drain pipe 414 is connected to the bottom wall of the cup 412.

A chemical solution pouring nozzle 420 pours a removing liquid for removing a protective film onto a central part of the wafer W. A drive mechanism 421 drives the chemical solution pouring nozzle 420 for movement along a guide rail 422 extended along the length of a processing vessel 430 parallel to the Y-axis between a waiting area 423 outside one end of the cup 412 and a working position substantially corresponding to the axis of rotation of the wafer W and for movement in vertical directions.

A cleaning liquid pouring nozzle 424 pours a cleaning liquid onto a central part of the wafer W. A drive mechanism 425 drives the cleaning liquid pouring nozzle 424 for movement along the guide rail 422 between a waiting area 423 outside the other end of the cup 412 and a working position substantially corresponding to the axis of rotation of the wafer W, and for movement in vertical directions. A processing vessel 430 is provided in its wall facing an operating space in which the transfer arm F2 operates with a doorway 431, and a shutter 432 closing the doorway 431.

In the protective film removing unit 402, the transfer arm F2 carries a wafer W through the doorway 431 into the processing vessel 430 and places the wafer W on the spin chuck 410. Then, a removing liquid for removing the protective film is poured through the chemical solution pouring nozzle 420 onto a central part of the wafer W, and the spin chuck 410 is rotated. Consequently, the removing liquid is spread radially outward on the wafer W by centrifugal force and the protective film is wetted with the removing liquid. Thus the protective film is removed from the surface of the wafer W.

Then, the chemical solution pouring nozzle 420 is moved to the waiting area 423, the cleaning nozzle 424 is moved to a pouring position substantially corresponding to the axis of rotation of the wafer W, the cleaning liquid is poured onto a central part of the wafer W and the spin chuck 410 is rotated. Consequently, the cleaning liquid is spread radially outward on the wafer W by centrifugal force. Thus the protective film removed from the wafer W and remaining on the wafer W is washed off by the cleaning liquid. The, the wafer W is rotated at a high rotating speed to dry the surface of the wafer W wetted with the cleaning liquid. The dried wafer W is carried out of the protective film removing unit 402 through the doorway 431 by the fourth transfer arm F2.

In the protective film forming unit 401, a chemical solution for forming a protective film is poured through the chemical solution pouring nozzle 420 onto the surface of the wafer W. The protective film forming unit 401 is similar to the protective film removing unit 402, except that the former is not provided with any nozzle corresponding to the cleaning liquid pouring nozzle 424. The chemical solution for forming a protective film is poured through the chemical solution pouring nozzle 420 onto a part around the axis of rotation of the wafer in the surface of the wafer W, the spin chuck 410 is rotated to spread the chemical solution for forming a protective film radially outward by centrifugal force to form a protective film on the wafer W.

The cleaning unit 403 will be described. The cleaning unit 403 is provided with a cleaning liquid pouring nozzle 424 for pouring a cleaning liquid, such as pure water, onto the surface of the wafer W. The cleaning unit 403 is similar to the protective film removing unit 402, except that the former is not provided with any nozzle corresponding to the chemical solution pouring nozzle 420. The cleaning liquid is poured through the cleaning liquid pouring nozzle 424 onto the wafer W while the cleaning liquid pouring nozzle 424 is moved along the guide rail 422 parallel to a straight line L substantially crossing the axis of rotation of the wafer W.

In the cleaning unit 403, the cleaning liquid is poured through the cleaning liquid pouring nozzle 424 onto a part substantially corresponding to the center of rotation of the wafer W while the spin chuck 410 is rotating as shown in FIG. 15(*a*). Then, the cleaning liquid pouring nozzle 424 is moved gradually toward the circumference of the wafer W to pour the cleaning liquid along the straight line L on the wafer W as shown in FIG. 15(*b*).

Figure 16:
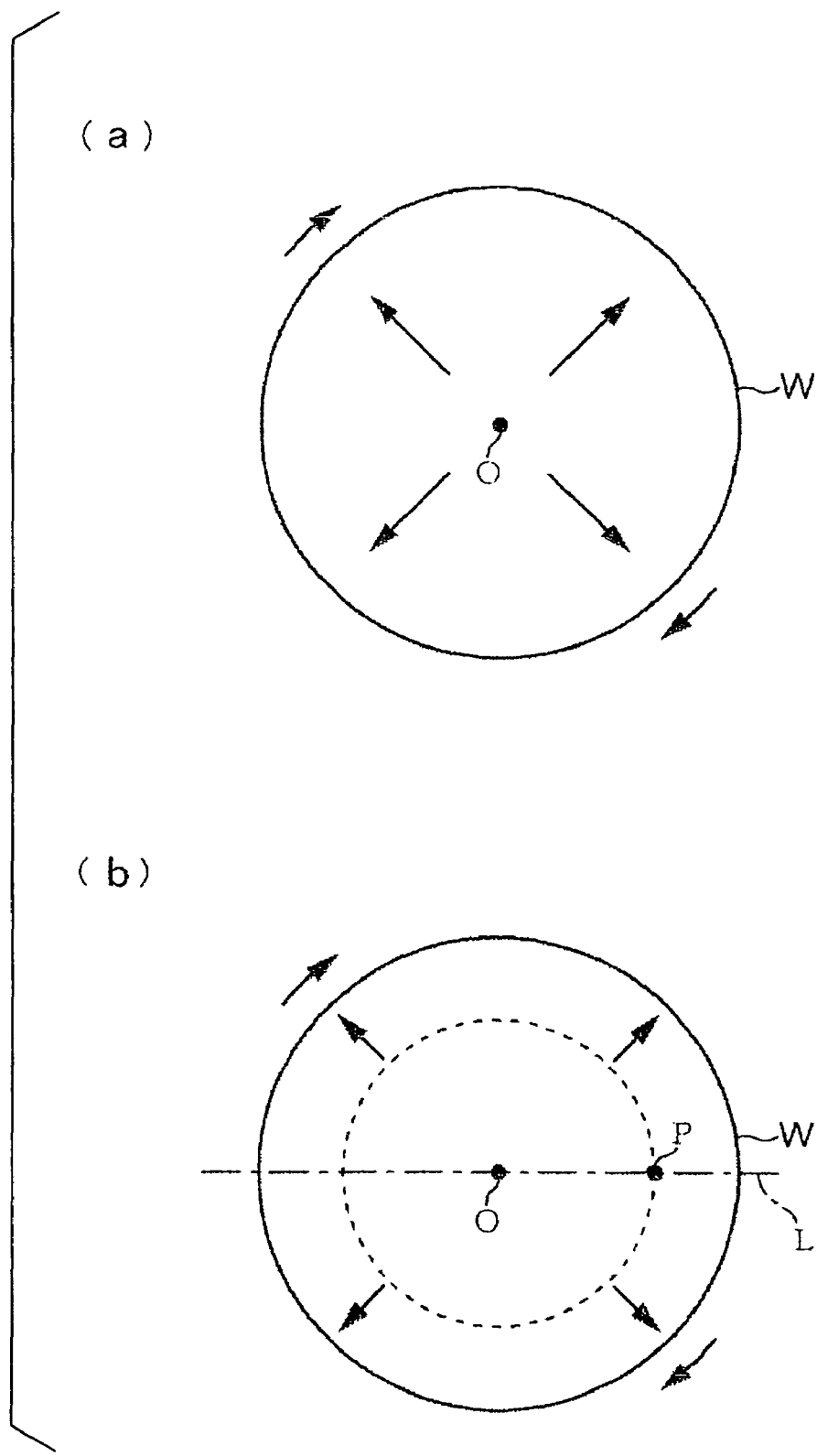
FIGS. 16(a) and 16(b) are views of assistance in explaining a cleaning method to be carried out by a cleaning unit included in the coating and developing system.

The cleaning liquid is spread radially over the surface of the wafer W by centrifugal force. When the cleaning liquid is poured onto a part around the center O of the wafer W, a circle of the cleaning liquid expands radially as shown in FIG. 16(*a*). When a pouring point P at which the cleaning liquid pouring nozzle 424 pours the cleaning liquid is moved radially outward toward the circumference of the wafer W, the cleaning liquid is poured on a circle containing the pouring points P, namely, a circle indicated by dotted line in FIG. 16(*b*), because the wafer W is rotating, and the cleaning liquid flows toward the circumference of the wafer W from the circle containing the pouring points P. A wet area wetted with the cleaning liquid shifts gradually outward from the center O of the wafer W and the entire surface of the wafer W is cleaned when pouring point is moved from the center O of the wafer toward the circumference of the wafer W to pour the cleaning liquid along the straight line L.

A cleaned part of the surface of the wafer W spreads from the center O toward the circumference of the wafer W when the wetted area wetted with the cleaning liquid thus shifts gradually from the center O toward the circumference of the wafer W. Since the cleaning liquid is spread by centrifugal force, the cleaning liquid does not flow inward from the pouring point P. Therefore, the surface of the wafer W dries gradually from a central part toward a peripheral part of the wafer W. Thus liquid drops are restrained from remaining on the surface of the wafer W. Since the eluate containing the resist and adhering to the wafer W and the liquid used for immersion exposure can be surely removed, production of particles from the eluate containing the resist and adhering to the wafer W and adverse effect on the line width of the pattern can be suppressed, intrasurface irregularity of a heat treatment attributable to the resist contained in the eluate and adhering to the wafer W and formation of watermarks can be prevented.

An immersion exposure process and a cleaning process to be carried out by the resist pattern forming system are similar to those to be carried out by, for example, the first embodiment. The wafer W is carried from the carrier block S1, along a carrying route sequentially passing the BCT layer B5, the COT layer B4 and the TCT layer B3. Then, the wafer W is carried along a route sequentially passing the second transfer stage TRS8 of the shelf unit U6, the second transfer arm D2, the second transfer stage TRS9 (or the transfer stage TRS10), the fourth transfer arm F1 of the auxiliary block S5, the protective film forming unit 401 of the shelf unit U8, the transfer stage TRS12 of the shelf unit U7, the interface arm B of the interface block S3, and the exposure system S4. The wafer processed by immersion exposure is carried along a route sequentially passing the interface arm B of the interface block S3, the cleaning unit 403, the interface arm B, the transfer stage TRS11 of the shelf unit U7 of the auxiliary block S5, the fourth transfer arm F2, the protective film removing unit 402 of the shelf unit U8, the fourth transfer arm F2, the transfer stage TRS6 (or the transfer stage TRS7) of the shelf unit U6 of the processing block S2, the main arms A1 and A2 and the developing layer B1 (or B2).

This embodiment is provided with the protective film forming unit 401 and the protective film removing unit 402, which are necessary when the wafer W is processed by immersion exposure, are installed in the auxiliary block S5 between the processing block S2 and the interface block S3. Therefore, the resist pattern forming system provided with the auxiliary block S5 can cope with a case where the wafer W is subjected to the immersion exposure process and a case where the wafer W is not subjected to the immersion exposure process without changing the lay out of the processing block S2. When the wafer W is not subjected to the immersion exposure process, the wafer W may be carried through the auxiliary block S5 without subjecting the wafer W to any process in the auxiliary block S5.

The wafer W can be processed by the foregoing processes while the wafer W is being transferred along a path between the processing block S2 and the interface block S3 when the resist pattern forming system is provided with the protective film forming unit 401 that processes the wafer after the film has been formed on the wafer and before the exposure process, and the protective film removing unit 402 that processes the wafer W after the exposure process and before the developing process. The film is a resist film or an antireflection film. Thus the complication of the carrying passage along which the wafer W is carried can be avoided and the wafer W can be processed at proper times after the film forming process and the exposure process. Even if those processes are necessary, the complication of a carrying program can be avoided.

A vacant space in the interface block S3 can be effectively used as a space for installing the cleaning unit 403. Therefore, the cleaning unit 403 does not need to be installed in the shelf unit of the processing block S2 or the interface block S3. Thus the number of types and the layout of the units included in the shelf units of the processing block S2 and the interface block S do not need to be changed, any additional space is not necessary for installing the cleaning unit 403 and hence increase in the size of the resist pattern forming system can be prevented.

Since the cleaning unit 403 is included in the interface block S3, the length of a carrying path along which the wafer W is carried between the immersion exposure system 54 and the cleaning unit 403 is short and the wafer W can be cleaned immediately after immersion exposure. Therefore, even if the wafer W is wetted with the eluate containing the resist and liquid drops, the wafer W can be surely cleaned. If the wafer W wetted with the eluate containing the resist and liquid drops is carried for a long distance, the wafer W is exposed to air for a long time. Consequently, the eluate containing the resist and the liquid drops are likely to react with air and are likely to change into substances that form water marks and the like that are difficult to remove by cleaning. The possibility of such undesirable changes of the eluate and the liquid drops due to contact with air can be reduced when the cleaning unit 403 is disposed near the immersion exposure system S4 and the eluate and the like can be easily removed from the surface of the wafer W by cleaning the surface of the wafer W with the cleaning liquid.

When any antireflection film is not formed, the protective film may be formed on the resist film. The wafer w may be cleaned by the cleaning process before or after the exposure process or before and after the exposure process . . . When any protective film is not formed, the cleaning unit 403 may b e used for simply removing contaminants from the wafer W. The cleaning unit 403 may be included in the auxiliary block S5.

Figure 17:
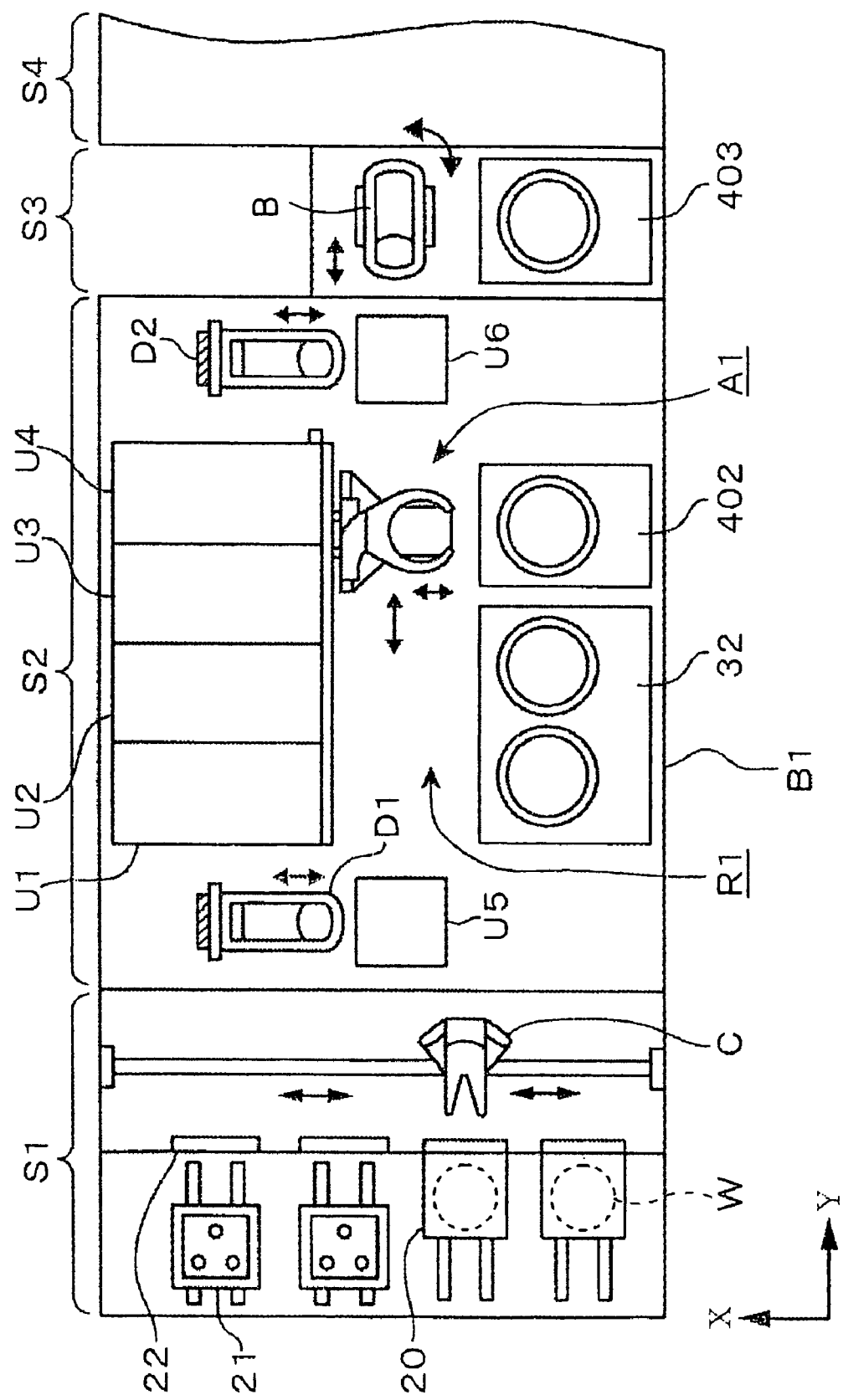
FIG. 17 is a plan view of a coating and developing system in a fourth embodiment according to the present invention.
Figure 18:
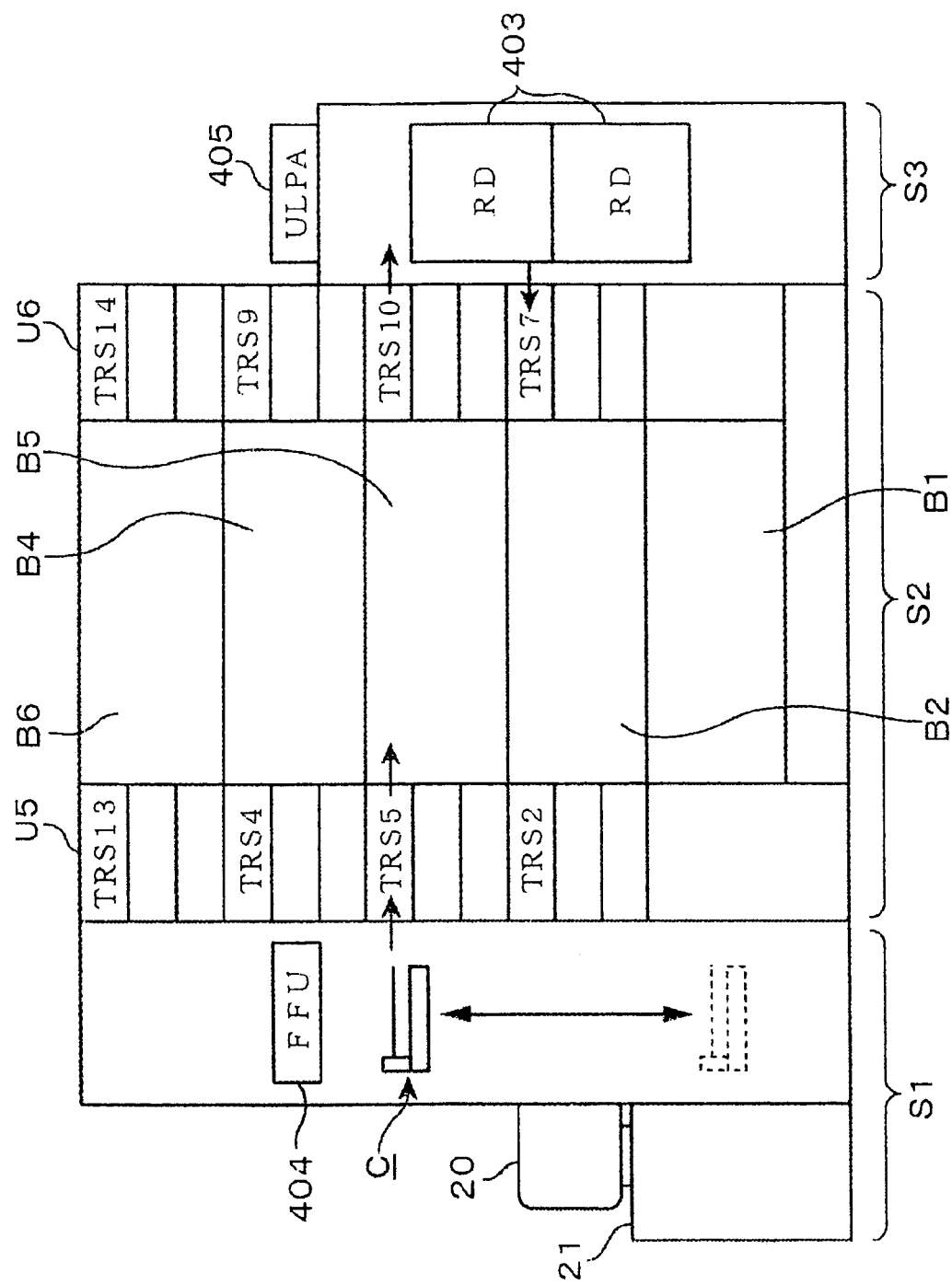
FIG. 18 is a sectional side elevation of the coating and developing system.
Figure 19:
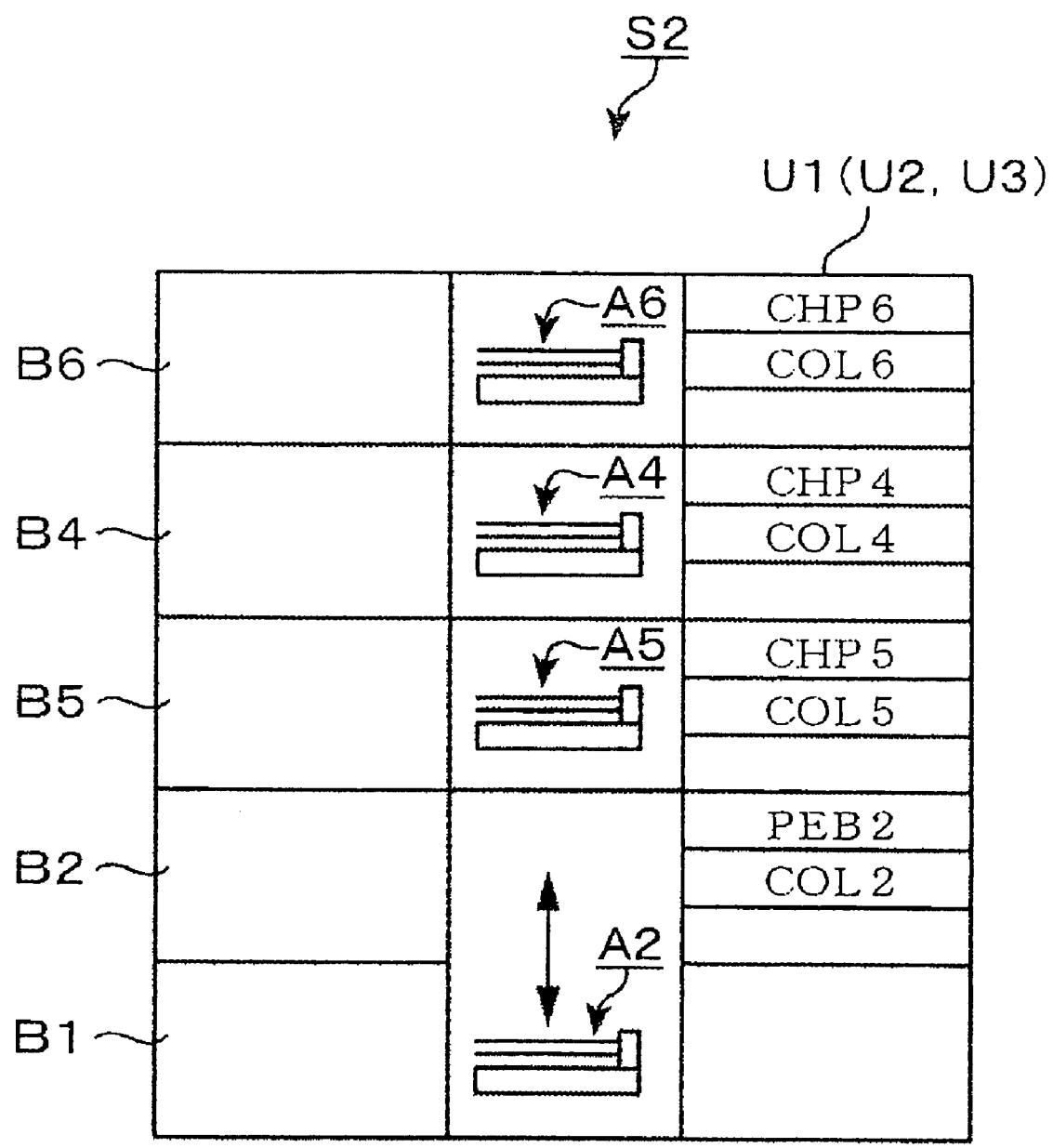
FIG. 19 is a sectional view of a processing block included in the coating and developing system taken from the side of an interface block.

FIGS. 17 to 19 show a resist pattern forming system in a fourth embodiment according to the present invention. The resist pattern forming system shown in FIGS. 17 to 19 is not provided with any auxiliary block S5 like the resist pattern forming system shown in FIG. 1, the resist pattern forming system may be provided with a unit block (ITC layer) B6 for forming a protective film, and a protective film removing units 402 may be included in the DEV layers B1 and B2 as shown in FIGS. 17 to 19. The layout of the components shown in FIGS. 17 to 19 is suitable for a case where any antireflection film is not formed on the resist film and a protective film is formed on the resist film. As shown in FIG. 18, a processing block S2 includes two DEV layers B1 and B2, a BCT layer B5, a COT layer B4 and an ITC layer B6 stacked upward in that order as shown in FIG. 18. The ITC layer B6 is similar to a TCT layer B3, except that the former is provided with a protective film forming unit 401, namely, a liquid-processing unit.

As shown in FIG. 17, the DEV layers B1 and B2 are provided, for example, with two developing units and a protective film removing unit 402, and an interface block S3 is provided with a cleaning unit 403. A wafer W is transferred from a carrier block S1 through a transfer stage TRS5 of the BCT layer B5 to the BCT layer B5. A wafer W is transferred from the processing block S2 through, for example, a transfer stage TRS10 of the BCT layer B5 to the interface block S3. The wafer W is carried from and to the modules of the DEV layers B1 and B2 by a common main arm A. Only the DEV layer B2 is provided with a first transfer stage TRS2, a second transfer stage TRS7 and shelf units U1, U2 and U3. In FIG. 18, only first transfer stages TRS2, TRS5, TRS4 and TRS13 of a shelf unit U5 respectively for the DEV layer B2, the BCT layer B5, the COT layer B4 and the ITC layer B6, and only second transfer stages TRS7, TRS10, TRS9 and TRS14 of a shelf unit U6 respectively for the DEV layer B2, the BCT layer B5, the COT layer B4 and the ITC layer B6 are shown for convenience.

Figure 11:
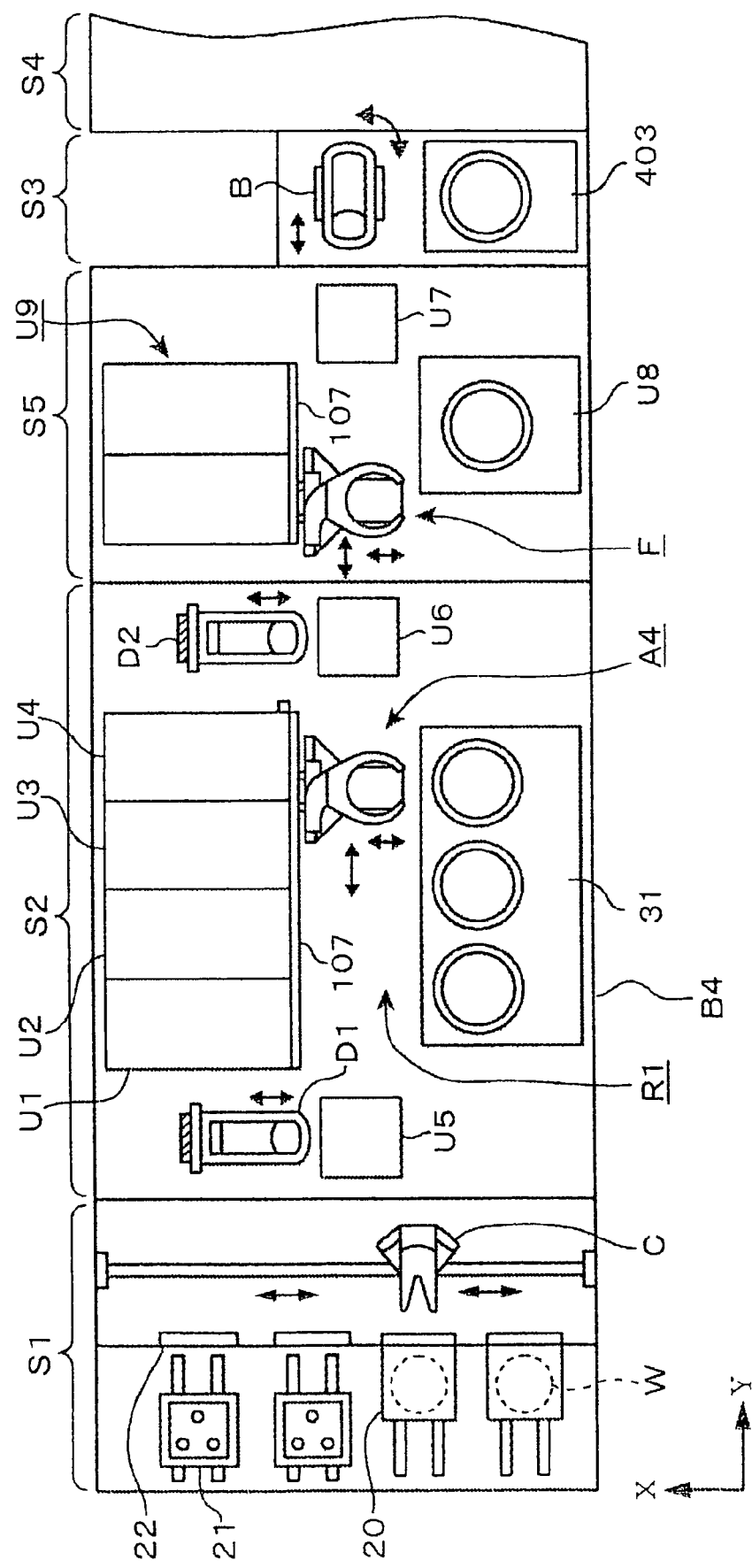
FIG. 11 is a plan view of a coating and developing system in a third embodiment according to the present invention.

The resist pattern forming system, similarly to that shown in FIG. 11, is provided with a filter unit (FFU) 404 placed in the carrier block S1 above a carrying space in which a transfer arm C carries a wafer W, and a ULPA filter 405 placed in an upper part of the interface block S3.

When the resist pattern forming system processes a wafer by an immersion exposure process and cleans the wafer processed by the immersion exposure process by a cleaning process, the resist pattern forming system, similarly to resist pattern forming system in the first embodiment, carries a wafer from the carrier block S1 along a carrying route sequentially passing the BCT layer B5, the COT layer B4 and the ITC layer B6, and then along a carrying route sequentially passing the second transfer stage TRS14 of the shelf unit U6, the second transfer arm D2, the second transfer stage TRS10, the interface arm B of the interface block S3 and an exposure system S4. The wafer processed by the exposure system S4 is carried along a carrying route sequentially passing the interface arm B of the interface block S3, the cleaning unit 403, the interface arm B, the transfer stage TRS7 of the shelf unit U6 in the processing block S2, the main arm A2, the protective film removing unit 402 of the DEV layer B1 (B2), the main arm A2 and the DEV layer B1 (B2).

The processing block S2 is provided with a unit block (ITC layer) B6 for forming a protective film. The interface block S3 is provided with a cleaning unit 403 for cleaning a wafer processed by the exposure process. The DEV layers B1 and B2 are provided with protective film removing units 402, respectively. Therefore, the wafer W can be processed sequentially by a protective film forming process before being subjected to an immersion exposure process, a cleaning process after immersion exposure and a protective film removing process after cleaning and before developing without being reversed on a pass between the processing block S2 and the exposure system S4. Consequently, the complication of the carrying passage along which the wafer W is carried can be avoided and the wafer W can be processed at proper times after the film forming process and the exposure process. Even if those processes are necessary, the complication of a carrying program can be avoided. A vacant space in the interface block S3 can be effectively used as a space for installing the cleaning unit 403 and the length of a carrying passage between the exposure system S4 and the cleaning unit 403 is short.

The resist pattern forming system may form an antireflection film and a protective film in that order on a resist film. When the resist pattern forming system forms the antireflection film and the protective film, for example, two DEV layers B1 and B2, a BCT layer B5, a COT layer B4, TCT layer B3 and an ITC layer B6 are stacked upward in that order in the processing block S2.

Figure 20:
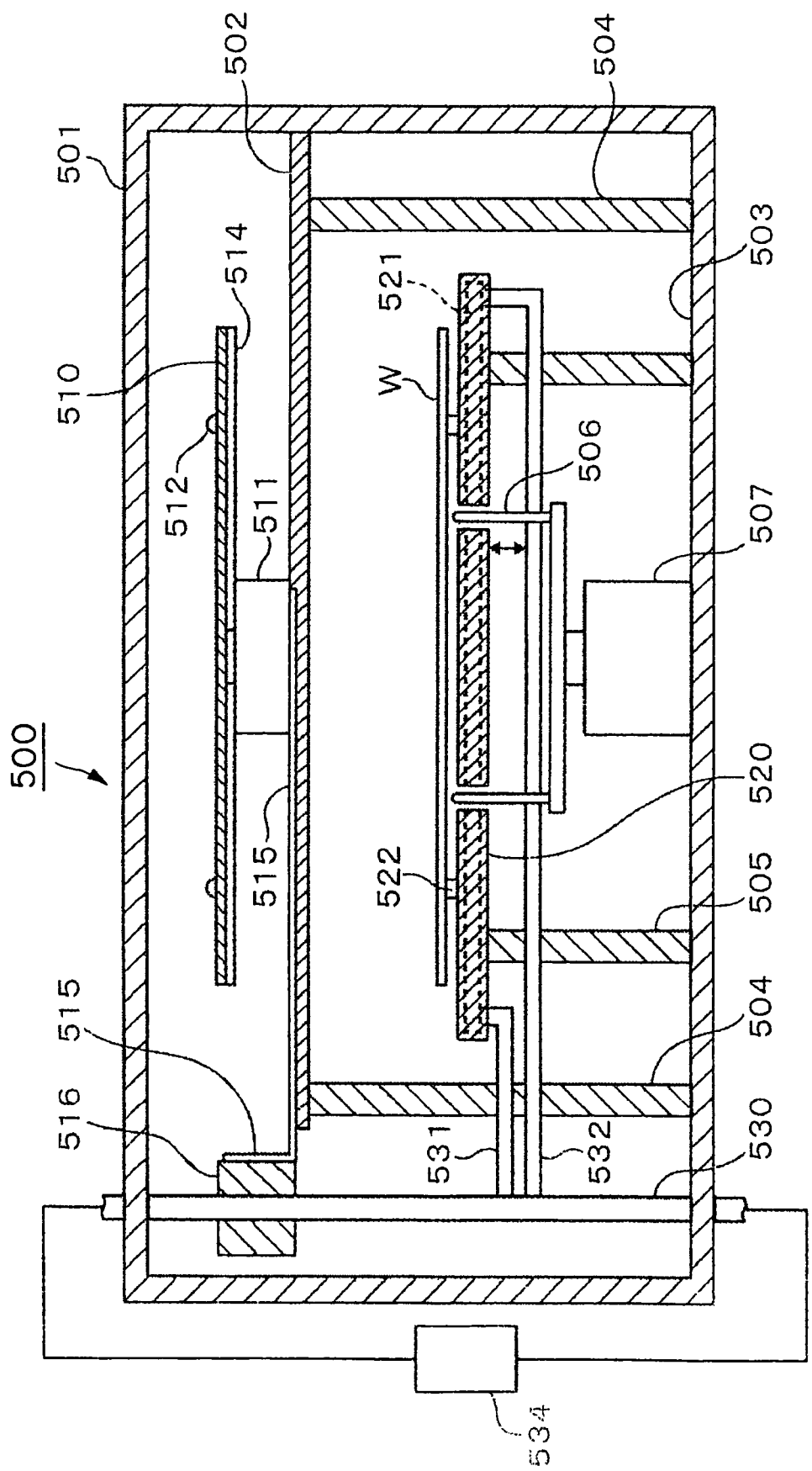
FIG. 20 is a longitudinal sectional view of a temperature adjusting unit included in the coating and developing system.

At least one of the first transfer stages of the shelf unit U5 and the second transfer stages of the shelf unit U6 may be used also as a temperature adjusting unit CPL for adjusting the temperature of the wafer W. The temperature adjusting unit (CPL) 500 adjusts the temperature of a wafer W to a temperature suitable for the application of a film forming chemical solution to the wafer W before forming a film on the wafer W. As shown in FIG. 20 by way of example, the temperature adjusting unit (CPL) 500 has a first temperature adjusting plate 510 for supporting a wafer W heated by a heating unit and for roughly adjusting the temperature of the wafer W to a first temperature, and a second temperature adjusting plate 520 for supporting the wafer W and for precisely adjusting the temperature of the wafer W to a temperature at which the film forming chemical solution is applied to the wafer W. The first temperature adjusting plate 510 is disposed above the second temperature adjusting plate 520 in a processing vessel 501. A liquid resist application process for applying a liquid resist to a wafer W, an antireflection film forming process for forming an antireflection film on a wafer W and a protective film forming process for forming a water-repellent protective film on a wafer W are chemical solution application processes.

The first temperature adjusting plate 510 is disposed above the second temperature adjusting plate 520 in the processing vessel 501. The interior of the processing vessel 501 is divided into an upper chamber and a lower chamber by a base plate 502. The base plate 502 is supported on first support members 504 set upright on the bottom wall 503 of the processing vessel 501. A central part of the first temperature adjusting plate 510 is seated on a support member 511 having, for example, a cylindrical shape. The support member 511 is made of a material having a high thermal conductivity.

Figure 21:
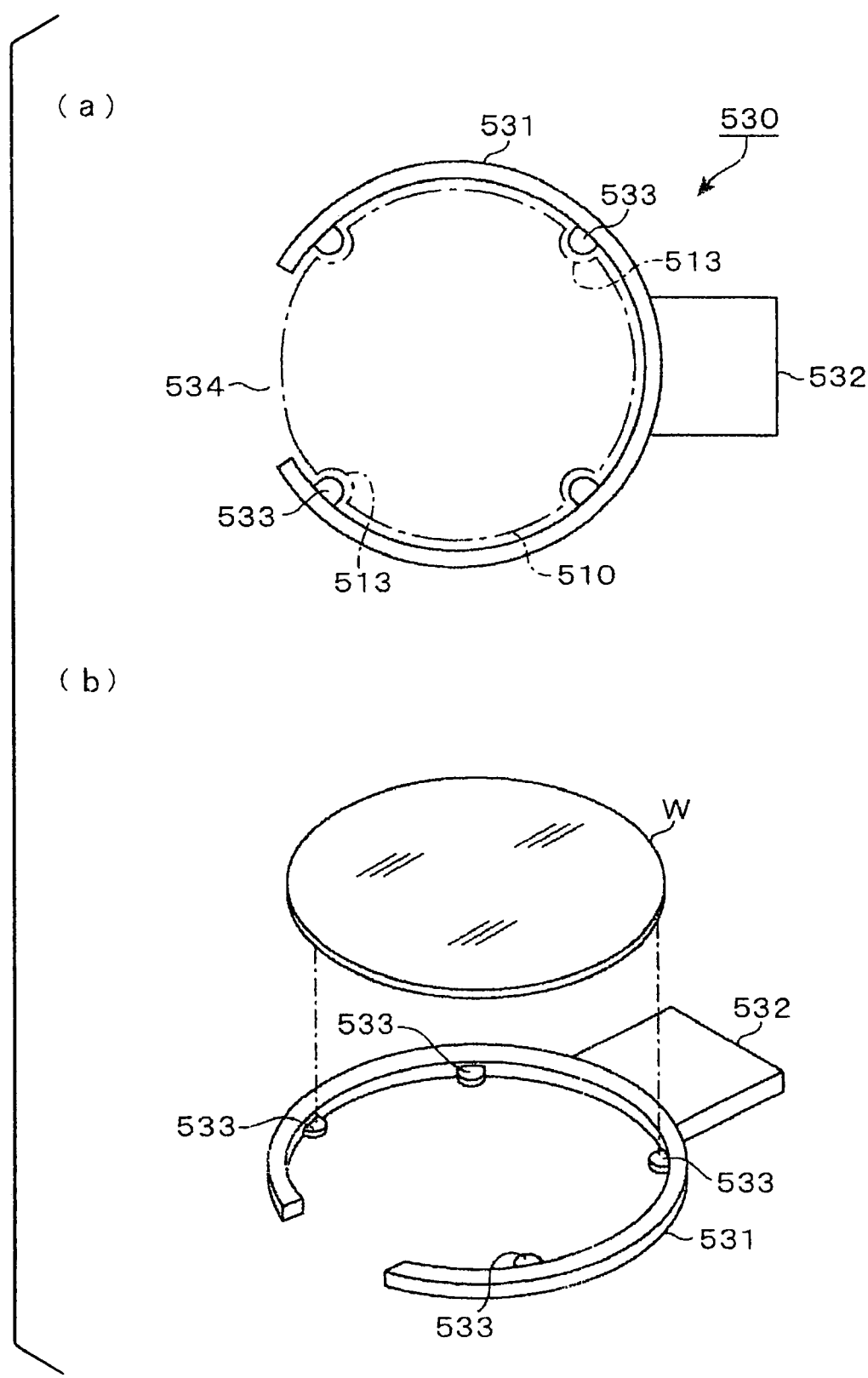
FIGS. 21(a) and 21(b) are a plan view and a perspective view, respectively, of a temperature adjusting unit included in the coating and developing system.

In this embodiment, the first temperature adjusting plate 510 is, for example, a substantially circular aluminum plate having, for example, a thickness on the order of 15 mm and a diameter substantially equal to that of a wafer W. Projections 512 are formed on the upper surface of the first temperature adjusting plate 510 to support a wafer W on the first temperature support plate 510 at a height between about 0.1 and about 0.3 mm from the upper surface of the first temperature adjusting plate 510. As shown in FIG. 21 by way of example, four cuts 513 are formed in the circumference of the first temperature adjusting plate 510.

The first temperature adjusting plate 510 is provided with a first heat pipe 514. The first heat pipe 514 is placed in a groove, not shown, formed in the back surface of the first temperature adjusting plate 510. A part of the heat pipe 514 is connected to the support member 511. The heat pipe 514 is extended on the entire back surface of the first temperature adjusting plate 510.

A second heat pipe 515 is embedded in the base plate 502 in contact with the lower surface of the support member 511. The second heat pipe 515 embedded in the base plate 502 has one end extending toward one end of the base plate 502 and the other end extending beyond the other end of the base plate 502, bent upward and connected to the surface of a heat transfer member 516 made of, for example, copper or aluminum.

Each of the heat pipes 514 and 515 is a heat transfer device for transferring heat by the agency of latent heat absorption by a fluid when the fluid vaporizes and latent heat release by the condensation of the vaporized fluid. Each of the heat pipes 514 and 515 has a sealed metal tube evacuated at a partial vacuum, such as an aluminum, stainless steel or copper tube, a porous capillary member coating the inside surface of the metal tube, and a small amount of a volatile liquid (working fluid), such as sodium or naphthalene, sealed in the metal tube. The porous capillary member is a metal net formed by interlacing fine metal wires or a metal felt.

When one end part (vaporization part) of the heat pipe is heated, the working fluid vaporizes and absorbs latent heat of vaporization. The vapor of the working fluid is caused to flow rapidly by a slight pressure difference through the metal tube to the other end part (condensation part) at a low temperature of the metal tube. The vapor is cooled and condenses when the vapor comes into contact with the wall of the other end part and releases latent heat of condensation. Thus heat is transferred from the vaporization part to the condensation part. The condensed working fluid is returned through the porous capillary member to the vaporization part by the capillarity of the porous capillary member. Thus a heat transfer cycle including vaporization, flow and condensation is repeated to transfer heat continuously. Therefore, the entire surface of the heat pipe is cooled uniformly when the other end part is cooled. The heat pipe does not need necessarily a generally known tubular heat pipe and may be a flat heat pipe formed by sealing a working fluid in a hollow, flat plate having a wide cavity.

The second temperature adjusting plate 520 is, for example, a substantially circular aluminum plate having, for example, a thickness on the order of 15 mm and a diameter greater than that of a wafer W. The second temperature adjusting plate 520 is internally provided with a passage 521 through which a temperature adjusting liquid of a predetermined temperature flows. Peripheral parts of the second temperature adjusting plate 520 is seated on second support members 505 set upright on the bottom-wall 503 of the processing vessel 501. The second support members 505 are arranged inside the arrangement of the first support members 504. Projections 522 are formed on the upper surface of the second temperature adjusting plate 520 to support a wafer W on the second temperature support plate 520 at a height between about 0.1 and about 0.3 mm from the upper surface of the second temperature adjusting plate 520.

Support pins 506 are moved by a lifting mechanism 506 so as to project from and to be retracted below the upper surface of the second temperature adjusting plate 520. An external carrying mechanism transfers a wafer W to and receives the same from the support pins 506. The lifting mechanism 507 is disposed inside the arrangement of the first support members 504.

A temperature adjusting liquid of an adjusted temperature flows through a circulation passage 530. A pipe of a material having high heat conductivity, such as aluminum, forming the circulation passage 530 is extended vertically through the processing vessel 501. The circulation passage 530 penetrates a substantially central part of the heat transfer member 516. A temperature adjusting liquid supply line 531 for supplying the temperature adjusting liquid into the passage 521 of the second temperature adjusting plate 520, and a temperature adjusting liquid discharge line 532 for discharging the temperature adjusting liquid from the passage 521 of the second temperature adjusting plate 520 are connected to the circulation passage 530. A temperature adjusting mechanism 534 disposed outside the processing vessel 501 adjusts the temperature of the temperature adjusting liquid.

The temperature adjusting liquid of a controlled temperature of, for example, 23° C. is circulated through the circulation passage 530. Since the first heat pipe 514 is thermally connected to the outside surface of the pipe forming the circulation passage 530 through the support member 511, the second heat pipe 515 and the heat transfer member 516, heat is transferred from the pipe forming the circulation passage 530 through the heat transfer member 516, the second heat pipe 515 and the support member 511 to the first heat pipe 514. Consequently, the first heat pipe 514 is heated at a temperature equal to the temperature of the wall of the pipe forming the circulation passage 530. Thus the temperature of the surface of the first temperature adjusting plate 510 is adjusted precisely to a temperature substantially equal to 23° C. The temperature adjusting liquid is circulated through the passage 521 of the second temperature adjusting plate 520. Thus the surface of the second temperature adjusting plate 520 is kept accurately at 23° C.

A carrying mechanism 530 for carrying a wafer W to and receiving the same from the first temperature adjusting plate 510 and the second temperature adjusting plate 520 will be described. When the temperature adjusting unit 500 is included in the shelf unit U5, the transfer arm C disposed in the carrier block S1, the first transfer arm D1 disposed in the processing block S2 or the main arm A disposed in each unit block is used as the carrying mechanism 530. When the temperature adjusting unit 500 is included in the shelf unit U6, the second transfer arm D disposed in the processing block S2, the main arm A of each unit block, the interface arm B disposed in the interface block 53 or the third transfer arm E, the fourth transfer arm F1 or the fourth transfer arm F2 disposed in the auxiliary block 55 is used as the carrying mechanism 530.

The carrying mechanism 530 has a horizontal carrying arm 531 of a shape resembling that of a horseshoe as shown in FIG. 21. The carrying arm 531 has an inside diameter slightly greater than the diameter of the first temperature adjusting plate 510. Four projections 533 project radially inward from the inside surface of the carrying arm 531 to support a wafer W thereon as shown in FIG. 21.

The carrying arm 531 is attached to a base member 532. The base member 532 holding the carrying arm 531 is moved vertically and horizontally by a driving mechanism, not shown. The carrying arm 531 holding a wafer W thereon is moved through a doorway, not shown, formed in a wall of the processing vessel 501 into the processing vessel 501 to carry the wafer W onto the first temperature adjusting plate 510. The cuts 513 of the first temperature adjusting plate 510 are arranged so as to coincide with the projections 533 of the carrying arm 531, respectively. When the carrying arm 531 is moved downward from above the first temperature adjusting plate 510, the carrying arm 531 is moved down past the first temperature adjusting plate 510 leaving the wafer W on the first temperature adjusting plate 510. After the wafer W has been thus transferred to the first temperature adjusting plate 510, the carrying arm 531 is retracted so that the support member 511 moves relative to the carrying arm 531 through a gap 534 in the carrying arm 531 outside the carrying arm 531 and is moved outside the processing vessel 501. The diameter of the support member 511 is smaller than the length of the gap 534 of the carrying arm 531.

To place a wafer on the second temperature adjusting plate 520, the support pins 506 are projected from the upper surface of the second temperature adjusting plate 520, the carrying arm 531 holding the wafer W is moved downward to transfer the wafer W to the support pins 506. Then the carrying arm 531 is retracted so that the support pins 506 move relative to the carrying arm 531 through the gap 534 in the carrying arm 531 outside the carrying arm 531 and is moved outside the processing vessel 501. Then, the support pins 506 are lowered to place the wafer W on the second temperature adjusting plate 520. The support pins 506 are arranged so that the carrying arm 531 can be retracted without-being interfered with by the support pins 506.

Figure 22:
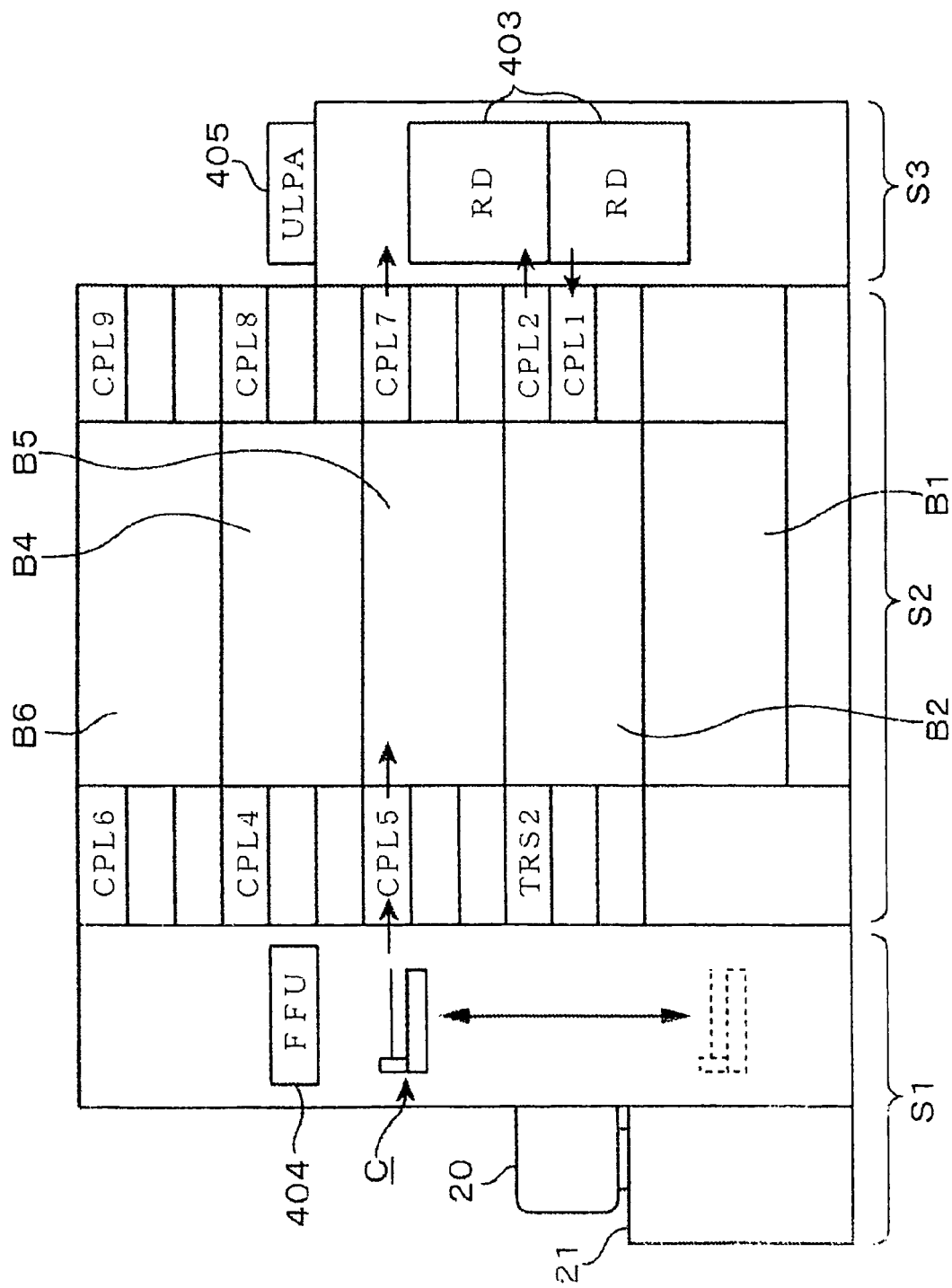
FIG. 22 is a sectional side elevation of assistance in explaining the layout of components of the coating and developing system including a temperature adjusting unit.
Figure 23:
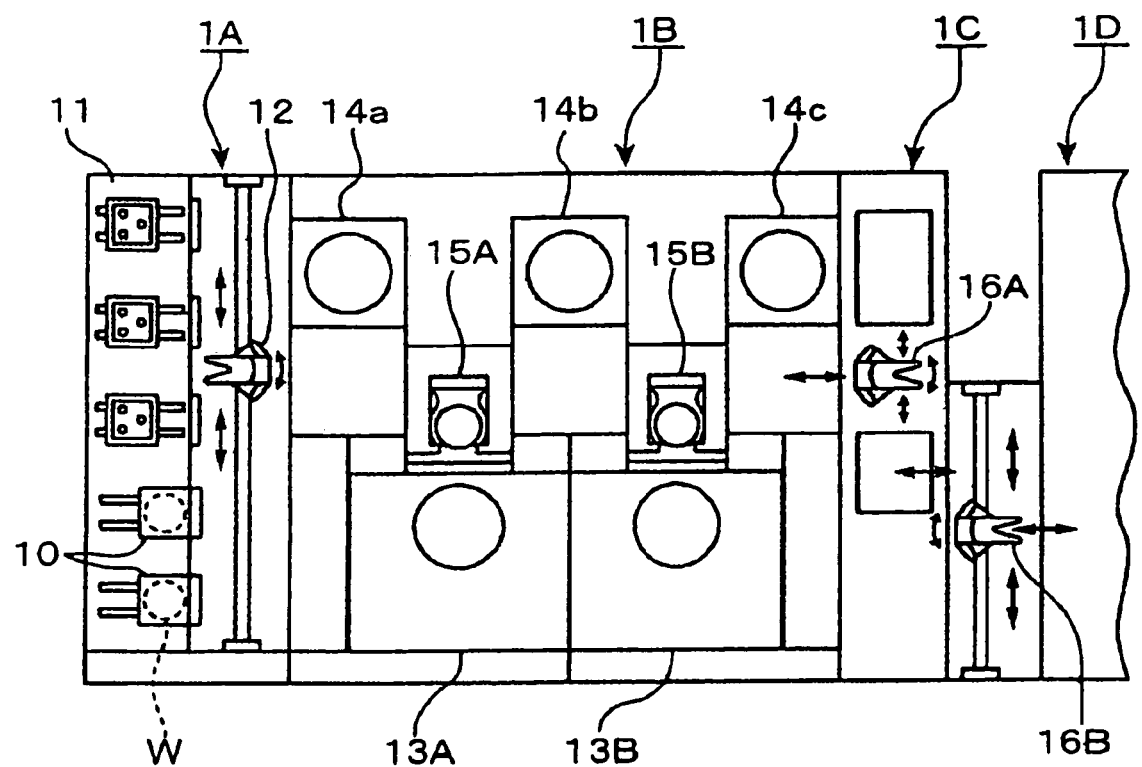
FIG. 23 is a plan view of a prior art coating and developing system.

The temperature adjusting unit 500 can be incorporated into any one of the foregoing resist pattern forming systems. The temperature adjusting unit 500 will be described on an assumption that the temperature adjusting unit 500 is incorporated into the resist pattern forming system shown in FIGS. 17 to 19 by way of example. Referring to FIG. 22, The BCT layer B5, the COT layer B4 and the ITC layer B6 of the shelf unit U5 are provided with temperature adjusting units CPL5, CPL4 and CPL6, respectively. The BCT layer B5, the COT layer B4 and the ITC layer B6 of the shelf unit U6 are provided with temperature adjusting units CPL7, CPL8 and CPL9, respectively. The DEV layer B2 of the shelf unit U6 is provided with two temperature adjusting units CPL1 and CPL2. The temperature adjusting unit CPL2 is used when a wafer W is transferred from the processing block S2 to the interface block S3. The temperature adjusting unit CPL1 is used when a wafer is transferred from the interface block S3 to the processing block S2.

In FIG. 22, only a transfer stage TRS2 for the DEV layer B2 of the shelf unit U5 is shown for convenience. Actually, the shelf units U5 and U6 of each unit block may be provided with a transfer stage TRS in combination with a temperature adjusting unit or the unit block may be provided with only a transfer stage TRS. The numbers of temperature adjusting units and transfer stages for the shelf unit U are selectively determined.

The flow of a wafer W in the system will be described. The transfer arm C transfers a wafer W from the carrier block S1 through the temperature adjusting unit (CPL5) of the BCT layer B5 to the BCT layer B5. The wafer W is placed on the second temperature adjusting plate 520 of the temperature adjusting unit (CPL5). The second temperature adjusting plate 520 heats the wafer W at 23° C.+0.2° C. Then, the main arm A5 carries the wafer W through the first antireflection film forming unit 34 and the heating unit (CHP5) in that order to the first temperature adjusting plate 510 of the temperature adjusting unit (CPL7) of the shelf unit U6. The heating plate 53 of the heating unit (CHP5) heats the wafer. The cooling plate 54 cools the wafer W roughly at about 50° C. The wafer W is kept on the first temperature adjusting plate 510 of the temperature adjusting unit (CPL7) for about 12 s to cool the wafer W roughly from 50° C. to 23° C.+1° C.

The transfer arm D2 carries the wafer W from the temperature adjusting unit (CPL7) to the second temperature adjusting plate 520 of the temperature adjusting unit (CPL8) to transfer the wafer to the COT layer B4. The wafer W is kept on the second temperature adjusting plate 520, for example, for 12 s to cool the wafer W from 23° C.+1° C. to 23° C.+0.2° C. Then, the main arm A4 carries the wafer through the hydrophobicity imparting unit (ADH), the cooling unit (COL4), the coating unit 31 and the heating unit (CHP4) in that order to the first temperature adjusting plate 510 of the temperature adjusting unit (CPL4) of the shelf unit U5. The wafer W roughly cooled at about 50° C. by the cooling plate 54 of the heating unit (CHP4) is kept on the first temperature adjusting plate 510 for about 12 s to cool the wafer W roughly at 23° C.+1° C.

Then, the first transfer arm D1 carries the wafer W from the temperature adjusting unit (CPL4) to the second temperature adjusting plate 520 of the temperature adjusting unit (CPL6) to transfer the wafer W to the ITC layer B6. The wafer W is kept on the second temperature adjusting plate 520, for example, for 12 s to cool the wafer W from 23° C.+1° C. to 23° C.+0.2° C. Then, the main arm A6 caries the wafer W through the protective film forming unit 401 and the heating unit (CHP6) onto the first temperature adjusting plate 510 of the temperature adjusting unit (CPL9) of the shelf unit U6. The wafer W roughly cooled at about 50° C. by the cooling plate 54 of the heating unit (CHP6) is kept on the first temperature adjusting plate 510 of the temperature adjusting unit (CPL9) for about 12 s to cool the wafer W at 23° C.+1° C.

Subsequently, the transfer arm D2 carries the wafer W from the temperature adjusting unit (CPL9) to the second temperature adjusting plate 520 of the temperature adjusting unit (CPL7) or the temperature adjusting unit (CPL2). The wafer is kept on the second temperature adjusting plate 52, for example, for 12 s to cool the wafer W from 23° C.+1° C. to 23° C.+0.2° C. Then, the interface arm B picks up the wafer W from the temperature adjusting unit (CPL7) or the temperature adjusting unit (CPL2) and carries the wafer W to the exposure system S4. The wafer W is subjected to a predetermined immersion exposure process. Then, the interface arm B carries the wafer W processed by the immersion exposure process to the cleaning unit 403, and carries the wafer W from the cleaning unit 403 to the second temperature adjusting plate 520 of the temperature adjusting unit (CPL1). The temperature adjusting unit (CPL1) cools the wafer W at 23° C.+0.2° C.

In the DEV layer B1 (DEV layer B2), the main arm. A2 carries the wafer W through the protective film removing unit 402, the heating unit (PEB1 (PEB2)), the cooling unit (COL1 (COL2)) and the developing unit 32 in that order to the heating unit (POST1 (POST2)). Thus the wafer W is subjected to a predetermined developing process. The transfer arm C carries the wafer W processed by the developing process through the first transfer stage TRS2 and returns the wafer W to the carrier 20 placed in the carrier block S1.

When the shelf units U5 and U6 are provided with the temperature adjusting units 500, which serve also as a transfer stage, the temperature of the wafer W can be adjusted during a waiting time for which the wafer W is held before the wafer W is transferred between the unit blocks, such as the carrier block S1 and the processing block S2, the processing block S2 and the interface block S3 or the processing block S2 and the auxiliary block S5. Consequently, processing time necessary for processing the wafer W can be reduced and the through put of the system can be improved.

When the wafer W is carried from and to the film forming unit blocks B4, B5 and B6, the wafer W is carried onto the first temperature adjusting plate 510 of the temperature adjusting unit 500 of the unit block for forming a first film to adjust the temperature of the wafer roughly to 23° C.+1° C., and then the wafer W is carried onto the second temperature adjusting plate 520 of the temperature adjusting unit 500 of the unit block for forming a second film to adjust the temperature of the wafer precisely to 23° C.+0.2° C. Since the temperature of the wafer W can be adjusted (cooled) stepwise, time necessary for temperature adjustment (cooling time) can be reduced.

The temperature of the first temperature adjusting plate 510 of the temperature adjusting unit 500 is adjusted to adjust the temperature of the wafer W to 23° C.+1° C. by the heat pipes 514 and 515. The temperature of the second temperature adjusting plate 520 of the temperature adjusting unit 500 is adjusted to adjust the temperature of the wafer W to 23° C.+0.2° C. by circulating the temperature adjusting liquid through the second temperature adjusting plate 520. Since the temperature adjusting liquid is not circulated through the passage 521 during the temperature adjustment of the first temperature adjusting plate 510, the temperature of the first temperature adjusting plate 510 can be adjusted without causing pressure loss in the temperature adjusting liquid in the passage 521. Consequently, the temperature of the second temperature adjusting plate 520 can be accurately adjusted because the flow rate of the temperature adjusting liquid in the passage 521 of the second temperature adjusting plate 520 does not vary.

The respective functions of the first temperature adjusting plate 510 and the second temperature adjusting plate 520 of the temperature adjusting unit 500 are equivalent to that of the cooling plate of the cooling unit (COL) shown in FIG. 1. Each of the unit blocks may be not provided with any cooling unit and may cool the wafer W by the first temperature adjusting plate 510 or the second temperature adjusting plate 520 of the temperature adjusting unit 500 instead of by the cooling unit.

When the number of the cooling units of each unit block is reduced or all the cooling units of each unit block are omitted, other units can be installed in spaces from which the cooling units have been removed. To improve the throughput, each unit block needs four heating units (CHP). Since such a need can be dealt with, the throughput can be further improved.

The temperature adjusting unit 500 may be provided with two or more first temperature adjusting plates 510 in a vertical arrangement. Since the carrying mechanism 530 transfers a wafer W held thereon to the first temperature adjusting plate 510 by moving downward past the temperature adjusting plate 510, any mechanism corresponding to the lifting mechanism for vertically moving the support pins to transfer the wafer W is not necessary. Therefore, the first temperature adjusting plate 510 can be installed in a space having a small vertical dimension and hence a plurality of first temperature adjusting plates 510 can be easily installed in a vertically layered arrangement in a space not having a very big vertical dimension.

The support pins 506 are moved vertically to place a wafer W on and to pick up the same from the second temperature adjusting plate 520. Therefore, the second temperature adjusting plate 520 may be larger than the wafer W and hence the second temperature adjusting plate 520 can satisfactorily adjust the temperature of a peripheral part of the wafer W. Since the temperature of the second temperature adjusting plate 520 can be accurately adjusted and hence the temperature of the wafer W can be adjusted so that temperature distribution on the surface of the wafer W is very uniform, the film forming process is able to form a film having a high intrasurface uniformity.

Although the first temperature adjusting plate 510 is almost the same as the wafer W in size, it is proved that the temperature of the wafer W can be adjusted to 23° C.+1° C. in satisfactory intrasurface uniformity by keeping the wafer W heated at 50° C. by the heating process on the first temperature adjusting plate 510 for 12 s.

The protective film forming unit 401 for forming a protective film on a wafer W to be subjected to immersion exposure may be installed in any one of other film forming unit blocks B3 to B5 instead of in the auxiliary block S5 or the special unit block (ITC) B6. The protective film removing unit 402 for removing a protective film from a wafer W processed by immersion exposure may be installed in any one of film forming unit blocks B3 to B5 instead of in the auxiliary block S5, the DEV layer B1 or the DEV layer B2. The cleaning unit 403 for cleaning the wafer processed by the immersion exposure may be installed in any one of the unit blocks B1 to B6 of the processing block S2 instead of in the interface block S3 or the auxiliary block S5.

What is claimed is:

1. A coating and developing system comprising:
   a carrier handling block for receiving a substrate carried thereto by a carrier;
   a processing block for processing a substrate transferred thereto from the carrier handling block to form films including a resist film on the substrate;
   an interface block for carrying a substrate to an exposure system, receiving a substrate processed by the exposure system and returning the substrate to the processing block to subject the substrate to a developing process and to transfer the substrate processed by the developing process to the carrier handling block; wherein
   a) the processing block is provided with a plurality of film forming unit blocks stacked up in layers and a developing unit block stacked up in layers with respect to the film forming unit blocks,
   b) the plurality of film forming unit blocks stacked up in layers include a liquid resist applying unit block for applying a liquid resist to a substrate and a liquid-processing unit block for applying a chemical solution for forming an antireflection film to a substrate; and
   c) each of the unit blocks includes a liquid-processing unit for applying a chemical solution to a substrate, a heating unit for heating a substrate, and a carrying means for carrying a substrate from one to another of the liquid-processing unit and the heating unit.

2. The coating and developing system according to claim 1, wherein each of the unit blocks comprise a cooling unit for cooling a substrate.

3. The coating and developing system according to claim 1 further comprising:
   carrying recipes specifying substrate carrying paths in the unit blocks; and
   a mode selecting means for selecting one of a first carrying mode in which a substrate is carried to all the unit blocks, a second carrying mode in which a substrate is carried to a liquid resist applying unit block, a liquid-processing unit block for forming an antireflection film before the liquid resist is applied to a substrate and a developing unit block for carrying out a developing process, and a third carrying mode in which a substrate is carried to a liquid resist applying unit block, a chemical solution applying unit block for applying a chemical solution for forming an antireflection film after the liquid resist has been applied to a substrate, and a developing unit block for carrying out a developing process;
   wherein the mode selecting means selects the unit blocks to which a substrate is to be carried and selects the carrying recipes for the selected unit blocks to process a substrate.

4. The coating and developing system according to claim 1 further comprising:
   a first transfer stage group of first transfer stages stacked up in layers for the unit blocks, disposed on the side of the carrier handling block to receive a substrate from and deliver a substrate to the carrying means of each unit block;
   a second transfer stage group of second transfer stages stacked up in layers and disposed on the side of the interface block to receive a substrate from and deliver a substrate to the carrying means of each unit block;
   a first substrate transfer means for carrying a substrate from one to another of the first transfer stages; and
   a second substrate transfer means for carrying a substrate from one to another of the second transfer stages.

5. The coating and developing system according to claim 4, wherein the first transfer stage group includes a transfer stage, for the carrier handling block, via which a substrate is carried between the carrier handling block and the processing block.

6. The coating and developing system according to claim 4, wherein the second transfer stage group includes an interface block transfer stage via which a substrate is carried between the interface block and the processing block.

7. The coating and developing system according to claim 1, wherein the liquid-processing unit included in the film forming unit block has a plurality of laterally arranged substrate holding devices, respectively for holding a plurality of substrates, placed in a common processing vessel, and a common chemical solution applying nozzle for applying a chemical solution to substrates held by the plurality of substrate holding devices.

8. The coating and developing system according to claim 1, wherein an auxiliary block provided with functional units, which carries out processes after a film forming process and before an exposure process and/or after the exposure process and before the developing process and after the developing process, is interposed between the processing block and the interface block.

9. The coating and developing system according to claim 8, wherein the functional units of the auxiliary block include at least one of a film thickness examining unit for examining the thickness of a film formed on a substrate, a cleaning unit for cleaning a substrate before the exposure process and/or after the exposure process, a defocus inspecting device for finding a faultily registered pattern occurred in the exposure system, an irregular coating detecting device for detecting irregularities in a liquid resist film, a faulty development detecting device for detecting defects in a developed film, a particle counting device for counting particles adhering to a substrate, a comet detecting device for detecting comets in a resist film formed on a substrate, a splash-back detecting device, a defect detecting device for detecting defects in the surface of a substrate, a scum detecting device for detecting residual resist remaining on a substrate processed by a developing process, a defect detecting device for detecting defects caused by a liquid resist applying process and/or a developing process, a line width measuring device for measuring lines of a patterned resist film formed on a substrate, and a register examining device for examining the register of a photomask on a substrate after an exposure process.

10. The coating and developing system according to claim 8, wherein the exposure system forms a liquid layer on the surface of a substrate for immersion exposure, the functional unit of the auxiliary block is a cleaning unit for cleaning a substrate processed by immersion exposure.

11. The coating and developing system according to claim 1, wherein the plurality film forming unit blocks are the same in the layout of the liquid-processing unit, the heating unit and the carrying means.

12. The coating and developing system according to claim 8, wherein the exposure system forms a liquid layer on a surface of a substrate for immersion exposure, and the functional unit included in the auxiliary block is a protective film forming unit for forming a water-repellent protective film on the resist film.

13. The coating and developing system according to claim 8, wherein the exposure system forms a liquid layer on a surface of a substrate for immersion exposure, and the functional unit included in the auxiliary block is a protective film removing unit for removing a water-repellent protective film formed on the resist film.

14. The coating and developing system according to claim 1, wherein the exposure system forms a liquid layer on a surface of a substrate for immersion exposure, and the developing unit block for carrying out a developing process is provided with a protective film removing unit for removing a water-repellent protective film formed on the resist film.

15. The coating and developing system according to claim 10 further comprising a film forming unit block, for forming a water-repellent protective film on the resist film formed on the substrate, placed on the plurality of stacked film forming unit blocks.

16. The coating and developing system according to claim 1, wherein the exposure system forms a liquid layer on a surface of a substrate for immersion exposure, and a cleaning unit for cleaning a substrate after immersion exposure is included in the interface block.

17. The coating and developing system according to claim 4, wherein the first transfer stage group is provided with a temperature adjusting unit for supporting a substrate before forming a film on the substrate and adjusting temperature of the substrate to a temperature at which a chemical solution for forming a film is applied to the substrate.

18. The coating and developing system according to claim 4, wherein the second transfer stage group is provided with a temperature adjusting unit for supporting a substrate before forming a film on the substrate and adjusting temperature of the substrate to a temperature at which a chemical solution for forming a film is applied to the substrate.

19. The coating and developing system according to claim 17, wherein the temperature adjusting unit is provided with a first temperature adjusting plate for supporting a substrate heated by a heating unit and for roughly adjusting the temperature of the substrate to a first temperature, and a second temperature adjusting plate for supporting a substrate and for precisely adjusting the temperature of the substrate.

20. A coating and developing method to be carried out by a coating and developing system comprising:
    a carrier handling block for receiving a substrate carried thereto by a carrier;
    a processing block for processing a substrate transferred thereto from the carrier handling block to form films including a resist film on the substrate;
    an interface block for carrying a substrate to an exposure system, receiving a substrate processed by the exposure system and returning the substrate to the processing block to subject the substrate to a developing process and to transfer the substrate processed by the developing process to the carrier handling block; wherein
    a) the processing block is provided with a plurality of film forming unit blocks stacked up in layers and a developing unit block stacked up in layers with respect to the film forming unit blocks,
    b) the plurality of film forming unit blocks stacked up in layers include a liquid resist applying unit block for applying a liquid resist to a substrate and a liquid-processing unit block for applying a chemical solution for forming an antireflection film to a substrate; and
    c) each of the unit blocks includes a liquid-processing unit for applying a chemical solution to a substrate, a heating unit for heating a substrate, and a carrying means for carrying a substrate from one to another of the liquid-processing unit and the heating unit; said coating and developing method comprising the steps of:
        forming a first antireflection film on a surface of a substrate by the film forming unit block;
        forming a resist film by applying a liquid resist to the first antireflection film formed on the surface of the substrate by the film forming unit block different from that formed the first antireflection film;
        forming a second antireflection film over the resist film by the film forming unit block other than that formed the resist film; and
        subjecting the substrate coated with the resist film and processed by an exposure process to a developing process by the developing unit block included in the layer other than that including the film forming unit blocks.

21. A coating and developing method to be carried out by a coating and developing system comprising:
    a carrier handling block for receiving a substrate carried thereto by a carrier;
    a processing block for processing a substrate transferred thereto from the carrier handling block to form films including a resist film on the substrate;

an interface block for carrying a substrate to an exposure system, receiving a substrate processed by the exposure system and returning the substrate to the processing block to subject the substrate to a developing process and to transfer the substrate processed by the developing process to the carrier handling block; wherein a) the processing block is provided with a plurality of film forming unit blocks stacked up in layers and a developing unit block stacked up in layers with respect to the film forming unit blocks, b) the plurality of film forming unit blocks stacked up in layers include a liquid resist applying unit block for applying a liquid resist to a substrate and a liquid-processing unit block for applying a chemical solution for forming an antireflection film to a substrate; and c) each of the unit blocks includes a liquid-processing unit for applying a chemical solution to a substrate, a heating unit for heating a substrate and a carrying means for carrying a substrate from one to another of the liquid-processing unit and the heating unit; said coating and developing method comprising the steps of:

selecting one of a first carrying mode in which a substrate is carried to all the film forming unit blocks, a second carrying mode in which a substrate is carried to the liquid resist applying unit block and to a liquid-processing unit block for forming an antireflection film before a resist film is formed on a substrate, and a third carrying mode in which a substrate is carried to the liquid resist applying unit block for applying a liquid resist to a substrate and to the liquid-processing unit block for applying a chemical solution for forming an antireflection film to a substrate after the liquid resist has been applied to the substrate;

forming films on the substrate by carrying the substrate from one to another of the film forming unit blocks in the selected carrying mode; and subjecting the substrate coated with the films and processed by an exposure process to a developing process by a developing unit block in a layer other than layers including the plurality of film forming unit blocks.

* * * * *